US011624906B2

(12) United States Patent
Price et al.

(10) Patent No.: US 11,624,906 B2
(45) Date of Patent: Apr. 11, 2023

(54) IR ILLUMINATION MODULE FOR MEMS-BASED EYE TRACKING

(71) Applicant: MICROSOFT TECHNOLOGY LICENSING, LLC, Redmond, WA (US)

(72) Inventors: Raymond Kirk Price, Redmond, WA (US); Yarn Chee Poon, Sammamish, WA (US); Rachel N. Ulanch, Seattle, WA (US); Rashelle Kay Yee, Lynnwood, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 259 days.

(21) Appl. No.: 16/291,252

(22) Filed: Mar. 4, 2019

(65) Prior Publication Data

US 2020/0285050 A1 Sep. 10, 2020

(51) Int. Cl.
*G02B 27/00* (2006.01)
*B81B 7/00* (2006.01)
(Continued)

(52) U.S. Cl.
CPC .......... *G02B 27/0093* (2013.01); *B81B 7/008* (2013.01); *B81B 7/02* (2013.01);
(Continued)

(58) Field of Classification Search
CPC ............ G02B 27/0093; G02B 27/0101; G02B 27/0103; G02B 27/017; G02B 27/0172;
(Continued)

(56) References Cited

U.S. PATENT DOCUMENTS 4,065,860 A 1/1978 Linton et al.
6,244,509 B1 6/2001 Klevtsov
(Continued)

FOREIGN PATENT DOCUMENTS

CN 108091210 A 5/2018
CN 207529044 U 6/2018
(Continued)

OTHER PUBLICATIONS

"International Search Report & Written Opinion issued in PCT Application No. PCT/US20/019772", dated Jul. 10, 2020, 12 Pages.
(Continued)

*Primary Examiner* — Marin Pichler
(74) *Attorney, Agent, or Firm* — Workman Nydegger

(57) ABSTRACT

An illumination system having a reduced z-dimensional profile, which is achieved by reflecting light out of plane relative to a light source that generated the light, is disclosed herein. This illumination system includes an IR illumination device, a collimating optic, a turning optic, and a waveguide. The turning optic is specially configured to receive IR light from the IR illumination device and to reflect the IR light out of plane relative to the emission orientation of the IR illumination device. The reflected IR light is reflected towards the collimating optic. The waveguide is positioned in a fixed position relative to the collimating optic and includes an input port or grating to receive the collimated IR light. By reflecting light out of the plane, the size of the illumination system can be beneficially reduced in the z-direction.

15 Claims, 14 Drawing Sheets

(51) Int. Cl.
  *B81B 7/02*    (2006.01)
  *G06F 3/01*    (2006.01)
  *G02B 27/01*   (2006.01)

(52) U.S. Cl.
  CPC ..... *G02B 27/0103* (2013.01); *G02B 27/0172* (2013.01); *G06F 3/013* (2013.01); *G02B 2027/0138* (2013.01); *G02B 2027/0174* (2013.01); *G02B 2027/0178* (2013.01)

(58) Field of Classification Search
  CPC .... G02B 2027/0138; G02B 2027/0161; G02B 2027/0174; G02B 2027/0178; G02B 2027/0187; G02B 26/0833; G02B 26/0816; B81B 7/008; B81B 7/02; G06F 3/013
  USPC .............................................. 359/13; 351/209
  See application file for complete search history.

(56) References Cited

U.S. PATENT DOCUMENTS

| | | |
|---|---|---|
| 10,149,958 B1 | 12/2018 | Tran et al. |
| 10,492,981 B1 | 12/2019 | Kumar |
| 2006/0114551 A1 | 6/2006 | Okada et al. |
| 2007/0263280 A1 | 11/2007 | Macon et al. |
| 2010/0014081 A1* | 1/2010 | Huening ............... G01J 3/2803 356/328 |
| 2010/0060551 A1 | 3/2010 | Sugiyama et al. |
| 2012/0105310 A1* | 5/2012 | Sverdrup ........... G02B 27/0172 345/8 |
| 2013/0077049 A1* | 3/2013 | Bohn .................. G02B 27/017 351/210 |
| 2013/0208362 A1 | 8/2013 | Bohn et al. |
| 2013/0208482 A1 | 8/2013 | Fleck et al. |
| 2015/0145777 A1 | 5/2015 | He et al. |
| 2015/0205126 A1* | 7/2015 | Schowengerdt ......... G02B 6/00 345/633 |
| 2016/0092731 A1 | 3/2016 | Dainty et al. |
| 2016/0231477 A1 | 8/2016 | Saarikko et al. |
| 2017/0285343 A1 | 10/2017 | Belenkii et al. |
| 2018/0149874 A1 | 5/2018 | Aleem et al. |
| 2019/0004322 A1 | 1/2019 | Alexander et al. |
| 2019/0004323 A1 | 1/2019 | Alexander et al. |
| 2019/0018485 A1 | 1/2019 | Aleem et al. |
| 2019/0056599 A1 | 2/2019 | Reshidko et al. |
| 2019/0179151 A1* | 6/2019 | Pierer .................. H01S 5/4093 |
| 2020/0026080 A1* | 1/2020 | Pierer .................... H01S 5/023 |
| 2020/0285307 A1 | 9/2020 | Price et al. |
| 2020/0285848 A1 | 9/2020 | Price et al. |

FOREIGN PATENT DOCUMENTS

| | | |
|---|---|---|
| JP | 2016090684 A | 5/2016 |
| WO | 2019033757 A1 | 2/2019 |

OTHER PUBLICATIONS

"Non Final Office Action Issued in U.S. Appl. No. 16/291,260", dated Jan. 24, 2020, 11 Pages.

"Non Final Office Action Issued in U.S. Appl. No. 16/291,256", dated Mar. 13, 2020, 10 Pages.

"International Search Report and Written Opinion Issued in PCT Application No. PCT/US20/019775", dated Jun. 18, 2020, 16 Pages.

"International Search Report and Written Opinion Issued in PCT Application No. PCT/US20/019572", dated Jun. 18, 2020, 10 Pages.

"Beam Divergence", Retrieved from: https://en.wikipedia.org/wiki/Beam_divergence, Dec. 27, 2020, 02 Pages.

* cited by examiner

IR ILLUMINATION MODULE FOR MEMS-BASED EYE TRACKING

BACKGROUND

Mixed-reality systems, including virtual-reality (VR) and augmented-reality (AR) systems, have received significant attention because of their ability to create truly unique experiences for their users. For reference, conventional VR systems create a completely immersive experience by restricting their users' views to only virtual environments. This is often achieved through the use of a head-mounted device (HMD) that completely blocks any view of the real world. As a result, a user is entirely immersed within the virtual environment. In contrast, conventional AR systems create an augmented-reality experience by visually presenting virtual images (i.e. "holograms") that are placed in or that interact with the real world.

As used herein, VR and AR systems are described and referenced interchangeably. Unless stated otherwise, the descriptions herein apply equally to all types of mixed-reality systems, which (as detailed above) include AR systems, VR systems, and/or any other similar system capable of displaying virtual images. As used herein, the term "virtual image" collectively refers to images rendered within a VR environment as well as images/holograms rendered in an AR environment.

Some of the disclosed mixed-reality systems use one or more on-body devices, such as HMD 100 shown in FIG. 1. HMD 100 provides a display that enables a user to view overlapping and/or integrated visual information (e.g., virtual images) in whatever environment the user is in, be it a VR environment, an AR environment, or any other type of environment. For instance, virtual content can be displayed on lens 105 and lens 110 of the HMD 100 for the user to view. Continued advances in hardware capabilities and rendering technologies have greatly improved how mixed-reality systems render virtual images.

Many mixed-reality systems also operate using eye tracking and iris recognition/detection modules. These modules are used to track or detect the user's eye in order to provide a more enjoyable experience for the user. For instance, with eye tracking, the mixed-reality system will be able to track the user's eye position to provide input into the system. With iris detection, the mixed-reality system can provide robust security features by ensuring that the proper user is using the mixed-reality system or that the mixed-reality system is being used in a proper manner (e.g., parental controls for young children). Many mixed-reality systems include a nosepiece 115 so the HMD 100 can be comfortably placed on the user's head. Located near this nosepiece 115 is a first camera 120 for tracking eye movements and eye characteristics of one eye and a second camera 125 for tracking eye movements and eye characteristics of the other eye. In this regard, first camera 120 and second camera 125 are placed near the user's eyes and are positioned directly towards those eyes to monitor movement and perform other types of detection. Sometimes, these tracking/detection devices utilize their own light sources to measure light reflecting from the user's eyes. Unfortunately, users often express feelings of discomfort as a result of these somewhat bulky cameras being positioned so near their eyes. As such, there is a need in the field to improve how eye tracking and iris recognition is performed in order to reduce or eliminate the discomfort felt by users of the mixed-reality system.

Additionally, as mixed-reality systems become more advanced, it is becoming more and more desirable to employ lasers and associated components (e.g., collimating optics, beam combiners, photodetectors/photodiodes, etc.) that have small/smaller form factors. Use of smaller units means that more hardware can be packaged together within the mixed-reality system at reduced costs. Therefore, in addition to improving eye tracking and iris detection, there is a substantial need in the field to reduce the size of laser-based systems.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

Embodiments disclosed herein relate to an improved type of illumination system that has a reduced z-dimensional profile, which is achieved by reflecting light out of plane relative to the optical axis of the illumination module that emitted the light.

In some embodiments, an illumination system includes an infrared (IR) illumination device, a collimating optic, a turning optic, and a waveguide. The turning optic receives IR light generated by the IR illumination device and reflects this IR light as reflected IR light. The reflected IR light is reflected out of plane relative to the IR illumination device towards the collimating optic. The collimating optic receives the reflected IR light, collimates the light, and emits collimated IR light. The waveguide is positioned in a fixed position relative to the collimating optic and includes an input port or grating to receive the collimated IR light.

In some embodiments, an illumination system includes an infrared (IR) illumination device, collimating optics, a turning optic, a red, green, blue (RGB) laser device, a display module assembly (DMA), and a waveguide. The RGB laser device is associated with at least a first collimating optic and generates RGB laser light that passes through this first collimating optic to produce collimated RGB laser light. The turning optic receives IR light generated by the IR illumination device and reflects this IR light as reflected IR light. The reflected IR light is reflected out of plane relative to the optical axis of the IR illumination device and is reflected towards a second collimating optic. The second collimating optic receives the reflected IR light, collimates the light, and emits collimated IR light. The DMA optically combines the collimated IR light with the collimated RGB laser light to generate combined light. The waveguide is positioned in a fixed position and includes an input port or grating to receive the combined light and to direct the combined light towards a user's eye. In some cases, the visible RGB light is incident on a different input port or grating of the waveguide.

In some embodiments, an illumination system includes an infrared (IR) illumination device, a turning optic, a waveguide, and one or more (e.g., or a plurality such as an array of) photodetector(s). The turning optic receives IR light generated by the IR illumination device and reflects this IR light as first reflected IR light. The first reflected IR light is reflected out of plane relative to the IR illumination device towards a collimating optic (e.g., the second collimating optic discussed above). The collimating optic receives the first reflected IR light, collimates the light, and emits collimated IR light. The waveguide is positioned in a fixed position and includes an input port or grating positioned to receive the collimated IR light. The waveguide is configured to direct the collimated IR light towards a user's eye. The photodetectors are configured to capture second reflected IR light that is reflected off of the user's eye as a result of the collimated IR light being directed towards the user's eye via the waveguide.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which:

FIG. 3A illustrates how a MEMS mirror system can be used in a VR type of HMD while

DETAILED DESCRIPTION

Figure 1:
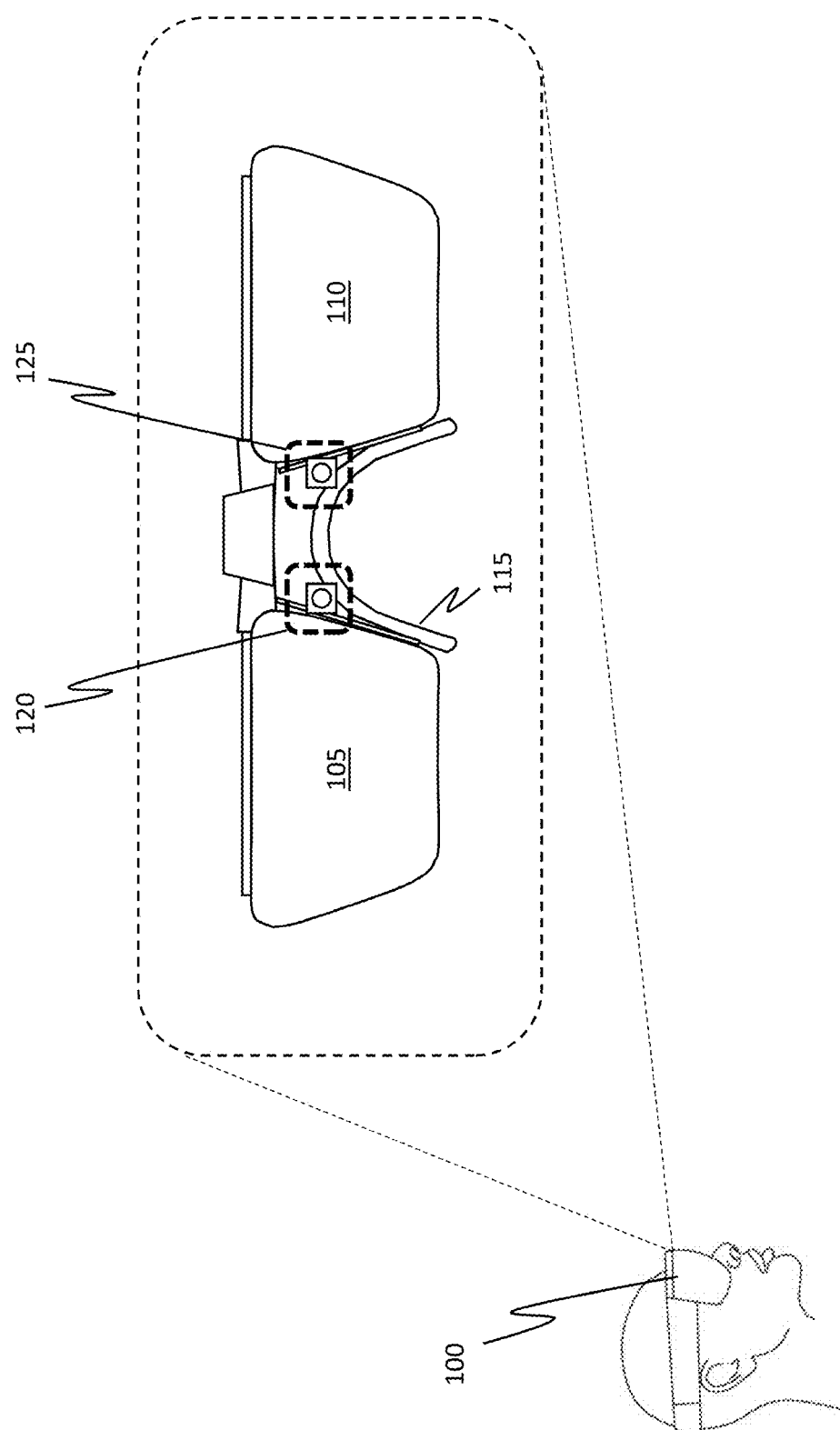
FIG. 1 illustrates a conventional HMD in which eye tracking cameras are placed near a nosepiece of the HMD and are aimed at the user's eyes. Often, users have expressed discomfort with such a setup.

Embodiments disclosed herein relate to an improved type of illumination system that has a reduced z-dimensional profile, which is achieved by reflecting light out of plane relative to the emission orientation, or rather the optical axis, of the light source that generated the light. By reflecting light out of plane (e.g., the reflected light may now be in the z dimension) relative to the optical axis of the laser (e.g., which optical axis may be in the x dimension), the size of the illumination system can be beneficially reduced (e.g., the z-dimensional profile is substantially reduced in size).

In some embodiments, an illumination system includes an IR illumination device, a turning optic, a collimating optic, and a waveguide. The turning optic receives IR light generated by the IR illumination device and reflects this IR light in a different direction. The reflected IR light is reflected out of plane relative to the orientation of the IR illumination device and is reflected towards the collimating optic. The collimating optic collimates the light and emits collimated IR light. The waveguide includes an input port or grating configured to receive the collimated IR light.

In some embodiments, an illumination system includes an IR illumination device, multiple collimating optics, a turning optic, an RGB laser device, a display module assembly (DMA), and a waveguide. A first collimating optic collimates the RGB laser light produced by the RGB laser device. The turning optic receives IR light and reflects this IR light as reflected IR light. The reflected IR light is reflected out of plane relative to the orientation, or rather the optical axis, of the IR illumination device and is reflected towards a second collimating optic. The second collimating optic collimates the light and emits collimated IR light. The DMA spectrally/optically combines the collimated IR light with the collimated RGB laser light to generate combined light. The waveguide includes an input port or grating configured to receive the combined IR light and directs the combined light towards a user's eye.

In some embodiments, an illumination system includes an IR illumination device, a turning optic, a waveguide, and photodetectors. The turning optic receives IR light and reflects this IR light as first reflected IR light. The first reflected IR light is reflected out of plane relative to the orientation or optical axis of the IR illumination device and is reflected towards a collimating optic (e.g., the second collimating optic mentioned above). The collimating optic collimates the light and emits collimated IR light. The waveguide includes an input port or grating positioned to receive the collimated IR light. The waveguide is also configured to direct the collimated IR light towards a user's eye. The photodetectors are configured to capture second reflected IR light that is reflected off of the user's eye as a result of the collimated IR light being directed towards the user's eye via the waveguide.

Technical Advantages and Benefit(s)

The disclosed embodiments bring about substantial benefits to the technical field. In particular, the disclosed embodiments are able to eliminate the need for additional camera hardware by removing the cameras previously used to track a user's eyes. Instead of using eye tracking cameras, the disclosed embodiments beneficially multi-purpose a scanning waveguide display that is already integrated into a mixed-reality system. The scanning waveguide display is now able to perform multiple functions (i.e. a multi-purpose scanning waveguide display). That is, eye tracking and iris detection can now be performed by emitting IR laser light through the scanning waveguide display and then using one or more (or a plurality such as an array of) photodetectors to capture reflected IR light that is reflected off of the user's eyes. This reflected IR light is used to generate images of the user's eyes, where the images are used to perform eye tracking and iris recognition. In doing so, the disclosed embodiments can achieve eye tracking and iris detection in a seamless manner that is transparent to the user as opposed to using additional and obstructive cameras uncomfortably positioned near the user's eyes. More specifically, the user will now no longer be discomforted as a result of having protruding and bulky eye tracking cameras positioned near the user's eyes. Instead, eye tracking and iris detection can now be performed using existing integrated components. In this regard, the disclosed embodiments reduce how much camera hardware is placed on the mixed-reality system's HMD.

Accordingly, instead of having cameras that look at the user's eyes and that take images, the disclosed embodiments effectively paint individual pixels of a user's eyes by rastering an IR illumination device across the eyes and then receiving or detecting the reflected IR signals. These reflected signals are then beneficially used to generate images of the user's eyes.

The disclosed embodiments also improve the technical field by reducing the z-dimensional profile of the IR illumination module used to emit the IR light for eye tracking and iris recognition. Specifically, previous illumination modules would align (in the z direction) a laser directly with a collimating optic. That is, the optical axis of the laser was directly in line, or rather parallel, to the collimating optic. The overall length of this assembly (i.e. the combination of the laser and the collimating optic) would include the entire length of the laser, the cover glass of the laser (e.g., for a standard TO-style laser package), the thickness of the collimating optic, and any distance in between the laser and the collimating optic. As such, the z-dimensional profile of the assembly previously included in the laser's length, the thickness of the collimating optic, and the distance therebetween. With reductions in the size of mixed-reality systems, this large z-dimensional profile was becoming unmanageable and undesirable.

Therefore, in accordance with the disclosed embodiments, an IR illumination module is disposed on a circuit board or other type of PCB. Beneficially, the IR illumination device is oriented parallel to the PCB and emits IR light in a direction parallel to the orientation of the PCB (e.g., in an x direction). That is, the PCB is oriented in parallel to the IR illumination device's optical axis. A turning optic is now provided to intercept the IR light and to redirect it in a direction out of plane (e.g., in the z direction) relative to the orientation/optical axis of the IR illumination device. Other light forming or bending optics (e.g., collimating optics, beam combiners, etc.) are positioned in the z direction and then manipulate the reflected light. By redirecting the light in this manner (e.g., redirecting light initially from an x direction to a z direction), the disclosed embodiments provide for an ultra-compact assembly that reduces the overall z-dimensional profile by about the length of the IR illumination device. That is, previously, the z-dimensional profile of the assembly included the entire length of the IR illumination device. Now, because the device is oriented in the x direction (as opposed to the previous z direction), the z-dimensional profile no longer includes the length of the IR illumination device. Instead, the z-dimensional profile includes only the height of the IR illumination device, which height is substantially smaller in size than the length. As such, the z-dimensional profile is beneficially reduced by a substantial amount.

Mixed-Reality Systems

Figure 2:
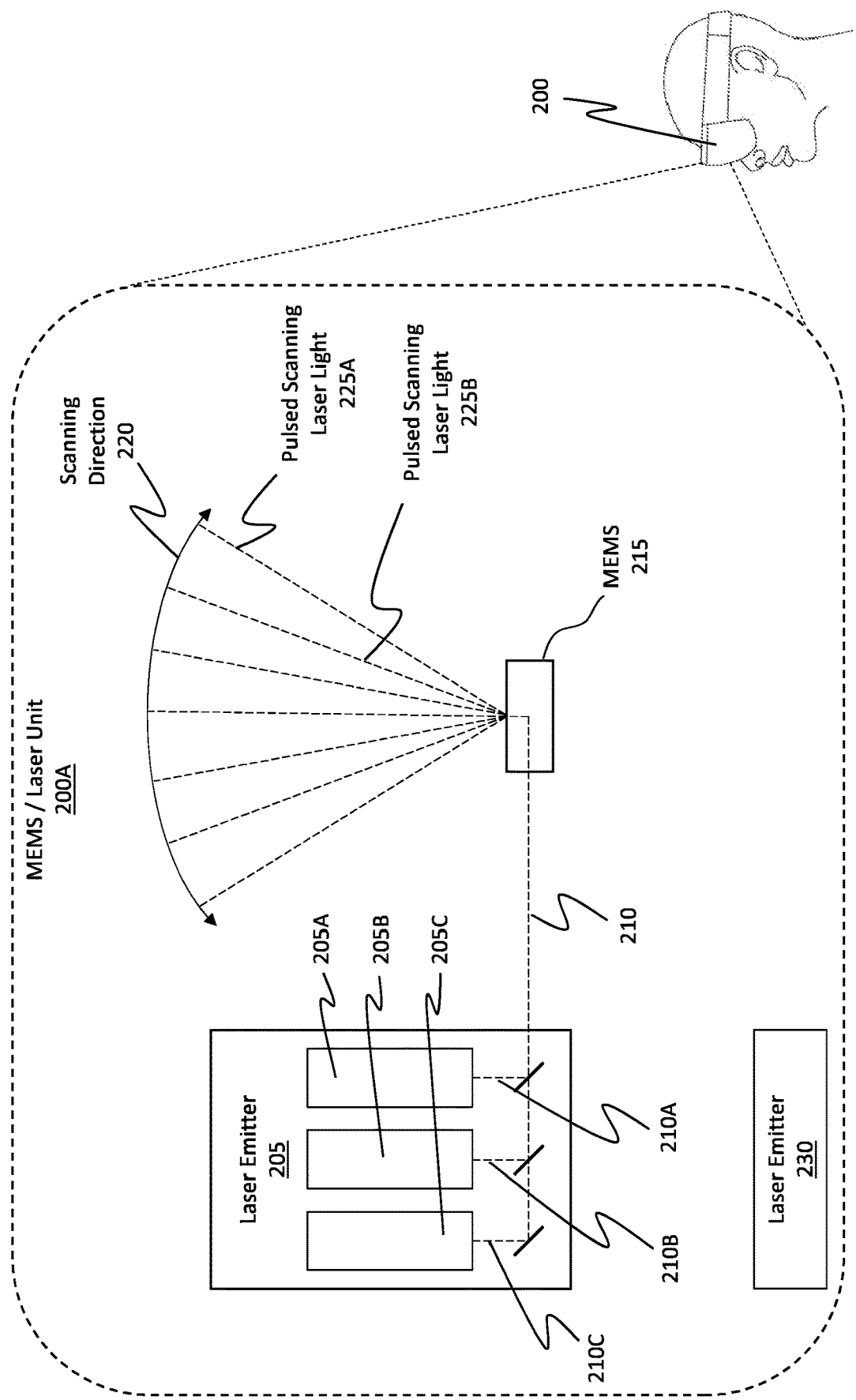
FIG. 2 illustrates a type of HMD that includes a microelectromechanical scanning (MEMS) mirror system that quickly rasters individual pixels in order to generate an entire image frame.

FIG. 2 shows some components that may be included within a display for a mixed-reality computing system, which includes HMD 200. These components are beneficially provided to render any type of virtual image. Specifically, FIG. 2 shows a MEMS/laser unit 200A that includes a laser emitter 205 which functions as a projector for the HMD 200.

Laser emitter 205 (aka "laser assembly," "laser device," or simply "laser") includes a (first) laser 205A, a (second) laser 205B, and a (third) laser 205C. Examples of these lasers may be a red laser, a green laser, and a blue laser such that the laser emitter 205 is a red, green, blue (RGB) laser assembly having RGB lasers. While only three lasers are presently shown, it will be appreciated that laser emitter 205 may include any number of lasers. Moreover, in some embodiments, lasers 205A, 205B, and 205C may be included within their own different discrete packaging unit. In some embodiments, an infrared (IR) laser may be included as a part of laser emitter 205 or within a separate packaging unit.

In some embodiments, such as the one shown in FIG. 2, the laser light from the lasers 205A, 205B, and 205C is optically/spectrally combined to form RGB laser light 210. That is, the laser light 210A from laser 205A, the laser light 210B from laser 205B, and the laser light 210C from laser 205C is optically/spectrally combined (e.g., either within the laser emitter 205 or outside of the laser emitter 205) to produce a single collimated beam of red, green, and blue RGB laser light 210. It will be appreciated that RGB laser light 210 may be a continuous beam of RGB laser light, or, alternatively, it may be a pulsed beam of RGB laser light. In the example shown in FIG. 2, RGB laser light 210 is a pulsed beam, as demonstrated by its dashed-line illustration.

RGB laser light 210 is then directed to a microelectromechanical scanning ("MEMS") mirror system 215. MEMS mirror system 215 includes a multi-directional mirror array that is able to rapidly redirect and aim laser light to any desired pixel location. For example, scanning direction 220 shows how MEMS mirror system 215 is able to rapidly redirect pulsed (or continuous) scanning laser light 225A and pulsed scanning laser light 225B to any location. Here, pulsed scanning laser light 225A and 225B originate from RGB laser light 210.

While only two instances of the pulsed scanning laser light (e.g., 225A and 225B) are labeled, it will be appreciated that MEMS mirror system 215 is able to redirect any number of pulsed emissions. By scanning laser light back and forth horizontally and up and down vertically, the MEMS/laser unit 200A is able to illuminate individual pixels of a virtual image within a desired field of view. Because MEMS/laser unit 200A is able to illuminate individual pixels so rapidly, MEMS/laser unit 200A is able to render an entire virtual image (e.g., an image frame) for a user to view and interact with without the user realizing that the virtual image was progressively generated by scanning individual pixels.

In some embodiments, MEMS/laser unit 200A includes more than one laser emitter. For instance, FIG. 2 shows a (second) laser emitter 230. In cases where there are more than one laser emitter, then the emitters can be configured to jointly or concurrently illuminate pixels to generate an image frame. For instance, in some embodiments, an image frame is illuminated by two separate laser emitters (e.g., laser emitter 205 and laser emitter 230). In some cases, the two separate laser emitters concurrently illuminate corresponding pixels. In other cases, the two separate laser emitters stagger when pixels are illuminated.

Figure 3B:
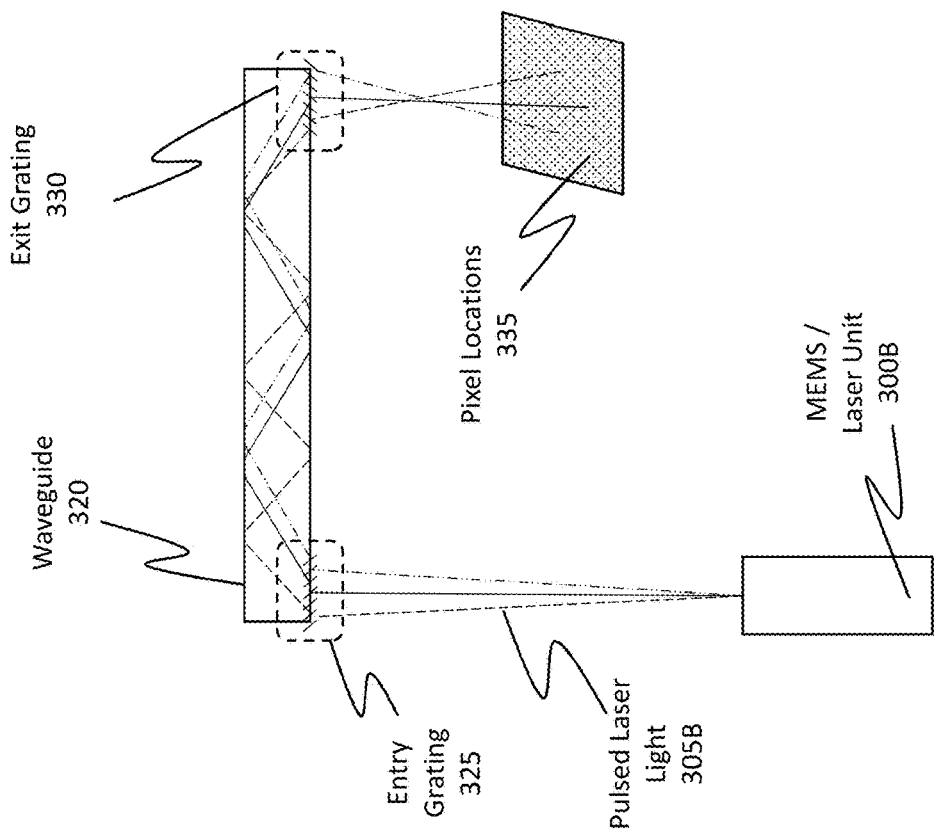
FIG. 3B illustrates how a MEMS mirror system can be used in an AR type of HMD.
Figure 3A:
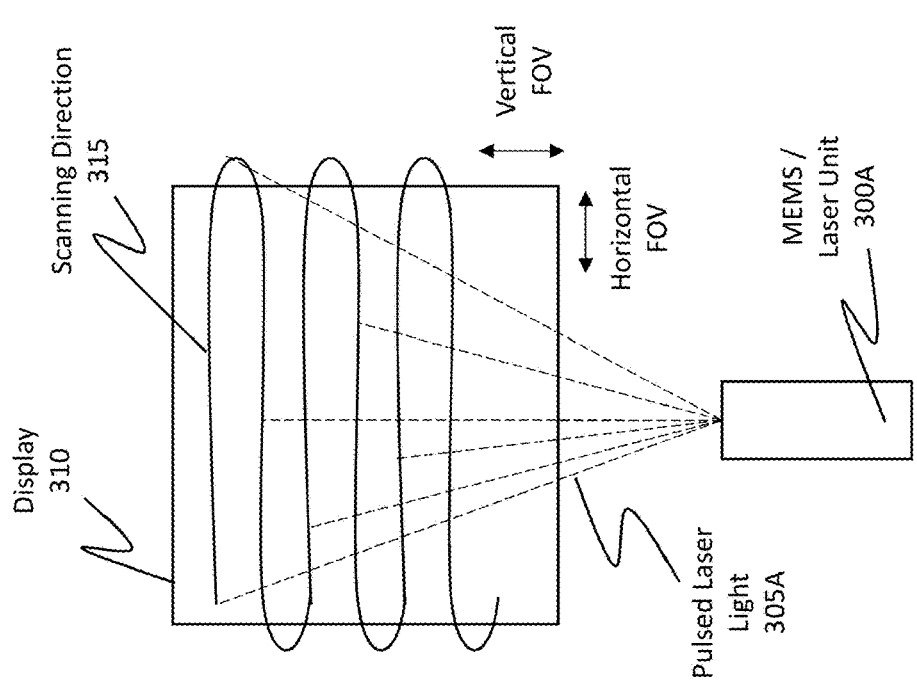

FIGS. 3A and 3B further expand on the operations of a MEMS mirror system by showing how a MEMS/laser unit 300A can be used in a VR type of HMD and how a MEMS/laser unit 300B can be used in an AR type of HMD, respectively. MEMS/laser units 300A and 300B are both example implementations of the MEMS/laser unit 200A from FIG. 2. Pulsed laser light 305A in FIG. 3A and pulsed laser light 305B in FIG. 3B are example implementations of RGB laser light 210.

In FIG. 3A, the display 310 is representative of a VR display of a VR type HMD. As described earlier, in a VR situation, the user's view of the real-world is entirely occluded such that the user is able to see only a VR environment. Here, display 310 is shown as including a vertical field of view ("FOV") and a horizontal FOV. FIG. 3A also shows the progressively backward and forward horizontal and upward and downward vertical scanning direction 315 in which the MEMS/laser unit 300A is able to scan individual pixels of a virtual image onto the display 310. By rapidly scanning/rastering the individual pixels, the MEMS/laser unit 300A is able to render an entire virtual image or even an entire VR environment.

Building on the earlier discussion, it will be appreciated that each pixel rastered on the display 310 is generated by pulsing the laser included within the MEMS/laser unit 300A. In this manner, it is possible to illuminate each pixel on display 310 in a pixel-by-pixel basis all the way from the top portion of the display 310 to the bottom portion of the display 310. Consequently, as the MEMS mirror system in the MEMS/laser unit 300A is scanned/aimed at a given pixel position on the display 310, the laser is pulsed to a determined intensity or power output level so as to properly illuminate that pixel within the overall virtual image.

FIG. 3B shows an example implementation within an AR system. Instead of scanning pixels on a display (e.g., display 310), the AR system causes its MEMS/laser unit 300B to scan pixels onto the user's eye through the use of a waveguide 320, which receives the laser light and then directs the laser light towards the user's eye. In this regard, FIG. 3B is representative of a scanning waveguide display, as referenced throughout this disclosure.

To illustrate, FIG. 3B shows MEMS/laser unit 300B generating pulsed laser light 305B which is directed towards waveguide 320. Waveguide 320 includes an entry grating 325 (aka an "input port" or "input grating"), through which pulsed laser light 305B enters waveguide 320, and an exit grating 330, through which pulsed laser light 305B exits waveguide 320. Waveguide 320 is structured to enable the pulsed laser light 305B to propagate through it so that the pulsed laser light 305B can be redirected to a desired location, such as pixel locations 335. In many instances, pixel locations 335 corresponds to a user's eye.

In this regard, there is a display module (e.g., the MEMS/laser unit 300B) that shines light into a waveguide (e.g., waveguide 320). Light is then refracted/reflected along that waveguide and then coupled out of the waveguide towards the user's eye. Therefore, instead of scanning light onto the display 310 in the VR scenario, pulsed laser light can be scanned to a user's eye in the AR scenario.

Figure 3C:
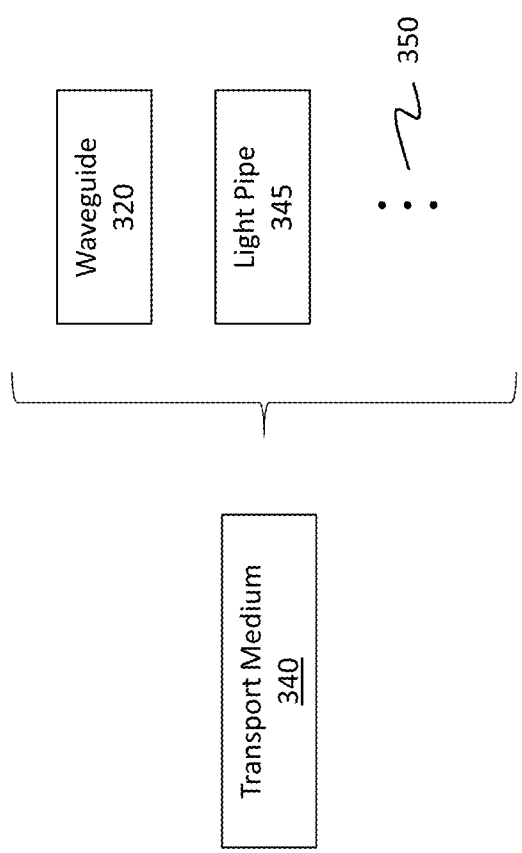
FIG. 3C illustrates how other types of transport mediums (besides just a waveguide) may also be used to redirect light so as to render virtual images or to redirect the light for other purposes.

FIG. 3C illustrates how waveguide 320 is one example of a transport medium 340. Transport medium 340 should be interpreted broadly to include or encompass any type of optical device capable of redirecting light to a desired location (e.g., pixel locations 335 in FIG. 3B). In this regard, transport medium 340 includes at least waveguide 320, but it also includes light pipe 345 (or "light tube" i.e. a type of optical fiber structure used to transmit light) and/or any other type of light transporting medium. Accordingly, ellipsis 350 symbolically represents how transport medium 340 may include any other type of reflective device (e.g., mirrors, prisms, fiber optics, tubular light devices, etc.).

Improved Illumination System Using an Integrated Scanning Waveguide Display

Figure 4A:
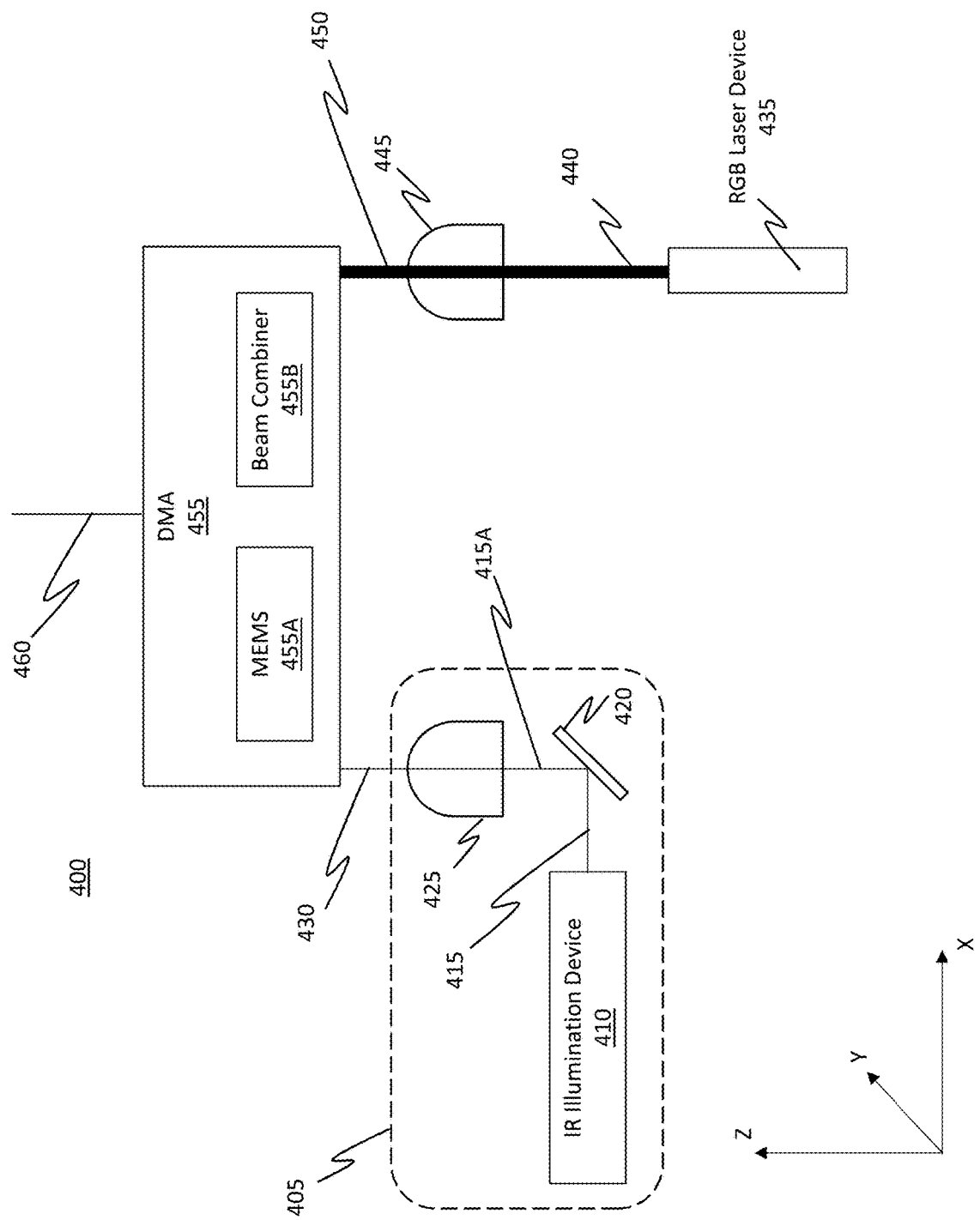
FIG. 4A illustrates a first portion of an illumination system/scanning waveguide display, where this first portion emphasizes how an improved type of infrared (IR) illumination module, assembly, or device may be used to reduce the module's z-dimensional profile and how eye tracking and iris detection may be performed using the scanning waveguide display as opposed to using cameras.

Attention will now be directed to FIG. 4A, which illustrates a first portion of an illumination system 400 capable of performing eye tracking and iris recognition/detection through use of an integrated scanning waveguide display as opposed to using separate eye tracking cameras. It will be appreciated that illumination system 400 may be a type of iris recognition illumination system and/or any type of eye tracking illumination system. Furthermore, as will be discussed later, illumination system 400 has a reduced z-dimensional profile, which is achieved by reflecting light out of plane relative to an emission orientation of the light source that generated the light.

Illumination system 400 is initially shown as including a reduced z-dimension IR module 405. IR module 405 includes an IR illumination device 410, which may be any type of IR illumination device such as, but not limited to, an IR laser, IR laser diode, and so on. In accordance with the disclosed embodiments, IR illumination device 410 has an emission orientation aligned in parallel with one axis direction (e.g., the x-axis). That is, IR illumination device 410 is shown as generating and emitting IR light 415 in the x-axis direction (i.e. its emission orientation). IR light 415 is also shown as being directed at or towards a turning optic 420.

Turning optic 420 receives the IR light from IR illumination device 410 and reflects the IR light as reflected IR light 415A out of plane relative to the emission orientation of the IR illumination device 410. For instance, turning optic 420 redirects the IR light 415 from the x-axis to the z-axis. Additional detail regarding the reduced z-dimensional profile will be provided later.

As further shown by FIG. 4A, reflected IR light 415A is reflected towards a collimating optic 425. After passing through collimating optic 425, reflected IR light 415A is emitted from collimating optic 425 as collimated IR light 430. As will be discussed in more detail later, by providing the turning optic 420, which reflects light out of plane relative to the orientation of the IR light's light source, the disclosed embodiments are able to reduce the overall packaging size of the IR module 405. Reducing the packaging size results in less space being occupied by the hardware components, which means more hardware can be packaged together to achieve improved performance for the mixed-reality system.

FIG. 4A also shows that illumination system 400 includes a red, green, blue (RGB) laser device 435 that emits RGB laser light 440. As will be discussed in more detail later, the beam size of RGB laser light 440 may be different than the beam size of IR light 430, hence RGB laser light 440 is shown as a bolded line.

It will be appreciated that RGB laser light 440 can be any combination of red laser light, green laser light, and/or blue laser light. In some instances, RGB laser light 440 includes only a single color (e.g., any one of red, green, or blue laser light). In other instances, RGB laser light 440 may include any combination of multiple colors (e.g., any combination of red, green, or blue laser light). As such, RGB laser light 440 can span different light wavelengths or spectral bandwidths. For this reason, RGB laser light 440 should be interpreted broadly to cover any type of light. Furthermore, FIG. 4A shows how IR illumination device 410 may be positioned at a fixed position relative to RGB laser device 435 within or on illumination system 400.

RGB laser device 435 is associated with one or more different collimating optic(s), as shown by collimating optic 445. RGB laser device 435 generates RGB laser light 440, which passes through collimating optic 445 to produce collimated RGB laser light 450.

In some embodiments, collimating optic 445 may be a single collimating optic such that each one of the red, green, and blue lasers is associated with the same single collimating optic. Consequently, this single collimating optic is able to receive multiple (e.g., in some embodiments, at least three) different or separate wavelengths of light (e.g., red laser light, green laser light, and blue laser light).

In other embodiments, collimating optic 445 may comprise multiple collimating optics. As an example, in some cases, a first collimating optic may collimate only red laser light, a second collimating optic may collimate only green laser light, and a third collimating optic may collimate only blue laser light. After being collimated by the three separate collimating optics, the collimated red, green, and blue laser light may then be spectrally or optically combined to form the collimated RGB laser light 450.

Accordingly, the disclosed embodiments may be configured in numerous ways and may support any number of collimating optics. It should also be noted, however, that collimating optic 425 is different and separate from collimating optic 445. That is, according to the disclosed embodiments, the collimating optic 425 used to collimate IR light is distinct from the collimating optic 445 used to collimate RGB light. Further discussion on this aspect will be provided later.

FIG. 4A also shows that illumination system 400 includes a display module assembly (DMA) 455. DMA 455 includes a MEMS mirror system 455A, which is representative of the MEMS mirror systems discussed earlier, as well as a beam combiner 455B. Using these components, DMA 455 is able to optically/spectrally combine the collimated IR light 430 generated by the IR illumination device 410 with the collimated RGB laser light 450 generated by the RGB laser device 435 to produce combined laser light 460.

Figure 4B:
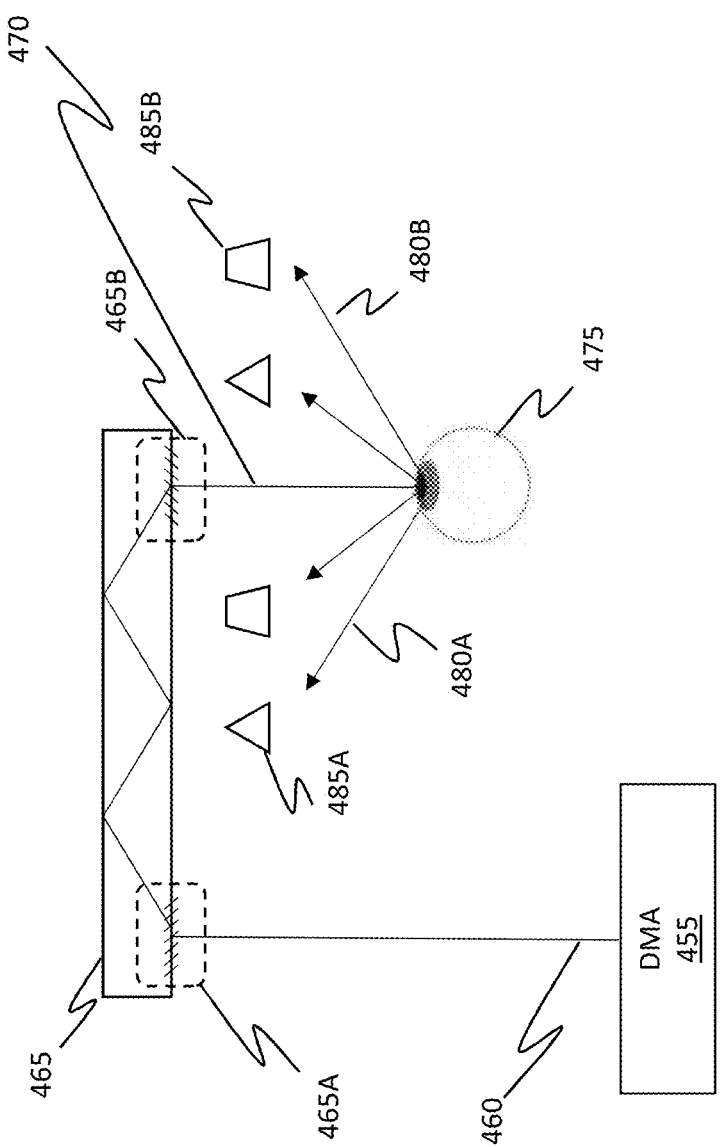
FIG. 4B illustrates a second portion of the illumination system, where this second portion emphasizes how a waveguide may be used to map the contours and features of a user's eye in order to perform eye tracking and iris detection.

FIG. 4B shows a second portion of the illumination system 400. Specifically, FIG. 4B shows the DMA 455 as well as the combined laser light 460, both of which were illustrated in the first portion of illumination system 400 provided in FIG. 4A. In this regard, FIG. 4B is a continuation of the illustration provided in FIG. 4A.

DMA 455 aims or otherwise directs the combined laser light 460 towards a waveguide 465, which may be representative of waveguide 320 from FIG. 3B. Waveguide 465 is positioned in a fixed position to receive the combined laser light 460, which comprises both collimated IR light and collimated RGB light. To clarify, waveguide 465 receives both collimated IR light (e.g., collimated IR light 430) as well as collimated RGB laser light 450 in the form of combined laser light 460. Additionally, the combination of FIGS. 4A and 4B show how waveguide 465 is positioned at a fixed position relative to DMA 455 and also to collimating optics 425 and 445.

Waveguide 465 is shown as including an input port or input grating 465A positioned to receive the combined laser light 460. Waveguide 465 is configured to direct, reflect, or propagate the combined laser light 460 towards a user's eye (including the eye's iris).

For instance, waveguide 465 includes an output port or exit grating 465B. The combined laser light 460 enters waveguide 465 via input grating 465A, propagates through waveguide 465, and exits waveguide 465 via the exit grating 465B as shown by light 470 exiting waveguide 465. Light 470 is aimed by the DMA 455 towards the user's eye 475. In this regard, a MEMS mirror system, which is included as a part of DMA 455, rasters combined light (e.g., light 470) at pixel locations across the user's eye 475.

As a result of light 470 being directed towards eye 475, one or more light reflections will reflect off of the user's eye 475, as shown by reflection 480A and reflection 480B. Because light 470 is a combination of IR light and RGB light, reflections 480A and 480B will include at least some IR light.

Illumination system 400 is also shown as including one or more photodetectors (e.g., photodetector 485A and photodetector 485B). Photodetectors 485A and 485B may be any type of photodetector capable of receiving, absorbing, and measuring light.

To clarify, a "photodetector" or "photodiode" is a type of semiconductor device that converts light into an electrical current. This electrical current is generated by the semiconductor device when light (or rather photons) is absorbed on the photodetector's light receiving surface. A photodetector includes a p-n junction. When a photon strikes or hits the photodetector, then an electron-hole pair is formed within the p-n junction, creating a photoelectric effect. Holes move toward the p-n junction's anode while the electrons move toward the p-n junction's cathode, thereby creating a photocurrent. Accordingly, photodetectors 485A and 485B are able to convert light into electrical current. As will be described in more detail later, this electrical current is used to measure and map the contours of the user's eye 475 to perform eye tracking and iris recognition.

Photodetector 485A is symbolically shown as a triangle while photodetector 485B is symbolically shown as a quadrilateral. These visual differences are provided to illustrate how illumination system 400 may include different types of photodetectors. For instance, some of the photodetectors may be configured to absorb and measure light from the visible spectrum while others of the photodetectors may be configured to absorb and measure light from other spectrums (e.g., the infrared spectrum). Therefore, at least some of the photodetectors 485A and 485B are able to measure IR light included as a part of reflections 480A and 480B. That is, one or more of these photodetector(s) include an IR detector configured to specifically detect reflected IR light included in reflections 480A and 480B. This reflected IR light is usable by illumination system 400 to perform eye tracking and/or iris recognition.

Accordingly, illumination system 400 includes one or more photodetector(s) (e.g., photodetectors 485A and 485B) that are configured to capture reflected IR light that is reflected off of the user's eye 475 (or iris) as a result of the light 470 (which includes collimated IR light and collimated RGB light and which is in the form of combined laser light) being directed towards the user's eye 475 (or iris) via the waveguide 465.

Figure 4C:
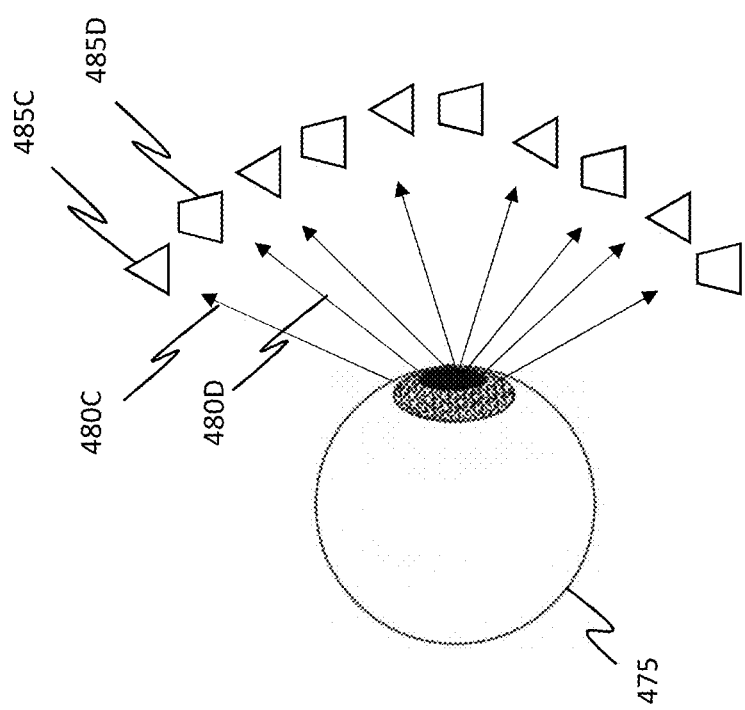
FIG. 4C illustrates how any number (e.g., an array) of photodetectors/photodiodes may be used to capture IR reflections that reflect off of the user's eye as a result of the waveguide directing IR light towards the user's eye.

FIG. 4C provides additional detail regarding how photodetectors are able to capture reflected light off of the user's eye. Specifically, FIG. 4C again shows the user's eye 475 as well as any number of reflections 480C and 480D. These reflections 480C and 480D occur as a result of a waveguide directing light, which includes IR light, towards the user's eye 475. Photodetectors 485C and 485D are positioned at locations sufficiently proximate to the user's eye 475 to capture the reflections 480C and 480D in order to measure the reflected IR light. Using this measured IR light, the illumination system is able to map the contours and other features of the user's eye 475 to perform eye tracking as well as iris recognition.

As used herein, the phrase "eye tracking" generally refers to the process of tracking the optical axis of the user's pupil to determine where the user is looking. Eye tracking allows the illumination system to perform foveated rendering, which is the process of producing high resolution content directly where the user is focusing his/her attention while producing lower resolution content at peripheral regions of the user's eye. Eye tracking also allows for the refined control of virtual image content and allows for the determination of the user's focus/intent (e.g., to gauge user interest or focus).

Iris recognition allows the illumination system to recognize which user is currently using the illumination system (or rather the mixed-reality system) for security-related operations or purposes. Iris recognition also allows the system to tailor content suitable for that user (e.g., by imposing parental controls for young children).

In this regard, reflected IR light can be processed by the illumination system to generate an image (e.g., a grey scale image) of the user's eye and/or iris in order to perform eye tracking and/or iris recognition. Therefore, instead of having discomforting or unsettling cameras continuously positioned near the user's eyes, the disclosed embodiments utilize an integrated scanning waveguide display to perform eye tracking and iris detection in a transparent manner. The scanning waveguide display effectively paints individual pixels on the user's eyes by rastering the IR illumination device across the eyes. The system then looks for reflected signals in order to generate images of the user's eyes for eye tracking and iris recognition.

Figure 4D:
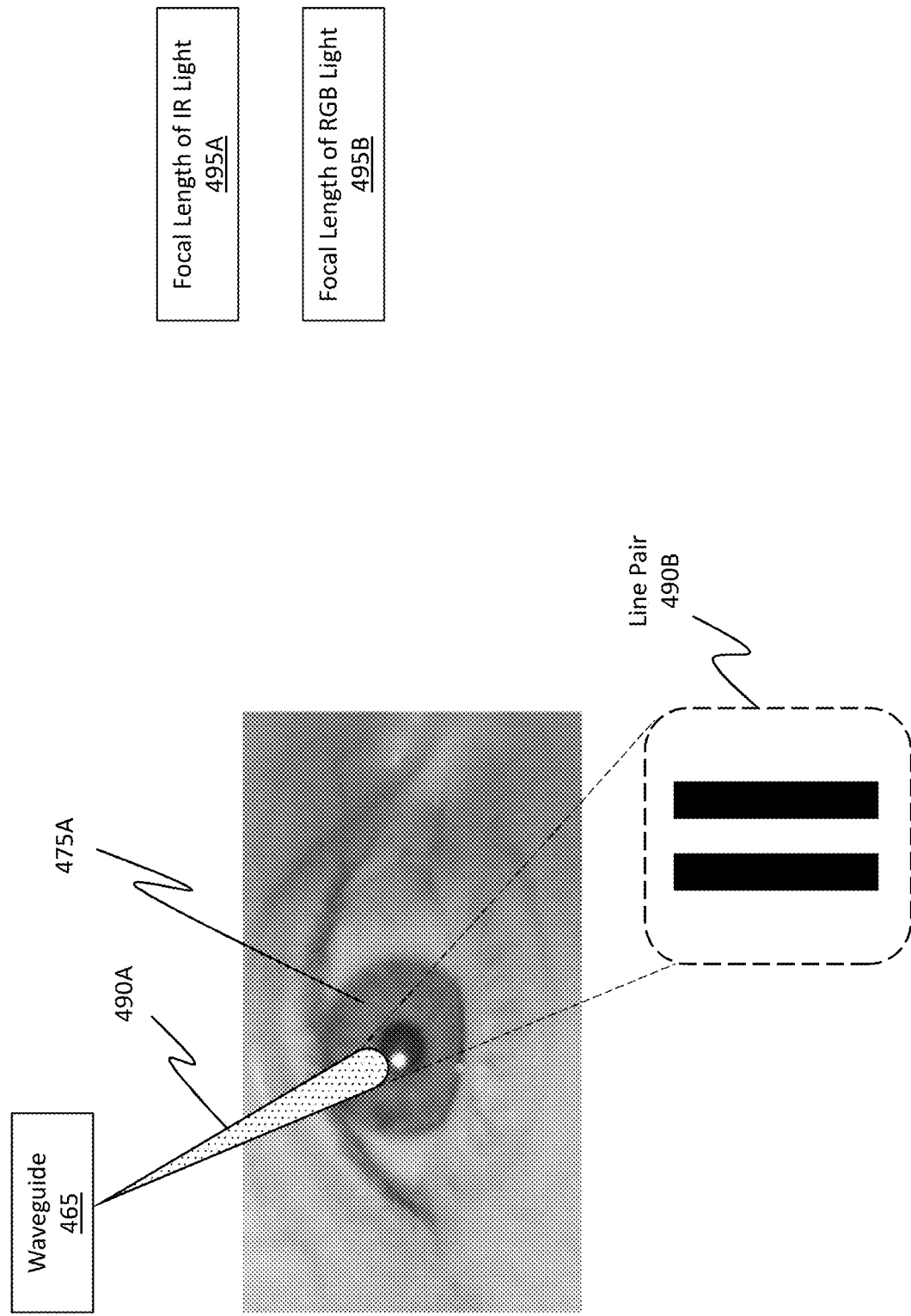
FIG. 4D shows how IR light can be rastered across a user's eye/iris to detect features of the user's iris, and where the rastering can be performed at an accuracy of at least 2 iris line pairs per millimeter, which is sufficient to spatially resolve (i.e. distinguish or detect) individual features of the user's iris. By resolving the user's eye in this manner, the system can generate images of the user's eye and can perform eye tracking or iris recognition.

FIG. 4D shows how using a scanning waveguide display to perform eye tracking and iris recognition can result in a highly accurate eye detection system. In particular, a user's iris is highly unique (even more unique than a fingerprint) and includes many thousands of iris lines. By rastering a small, collimated IR laser beam across the user's eye, the photodetectors are able to capture reflected IR light and to generate an IR eye image, which is then used to determine the features of the user's iris in a highly accurate manner. For instance, the accuracy is within a range of at least two line pairs per millimeter for iris recognition (i.e. the resolution of the captured light allows for at least two iris line pairs per millimeter to be resolved or identified by the system).

FIG. 4D shows how waveguide 465 is able to emit laser light 490A (e.g., IR laser light), which is rastered across the user's iris 475A to detect features of the user's iris 475A. This rastering can be performed at an accuracy of at least 2 iris line pairs per millimeter, which is sufficient to spatially resolve (i.e. distinguish or detect) individual features of the user's iris 475A. FIG. 4D shows an example of a line pair 490B, which is included in the user's iris 475A. The photodetectors can map or otherwise detect the contours, or rather attributes of the iris line pairs, of the user's iris 475A to detect line pair 490B. By detecting a sufficient number or amount of line pairs, the iris recognition system can accurately distinguish one user from another user. In this regard, the disclosed embodiments are able to utilize an IR laser to raster IR light across the user's eye to resolve individual features of the iris and pupil.

It will be appreciated that smaller sized IR beams or spots will enable the system to more accurately resolve the user's iris 475A as compared to larger IR spot sizes. That is, larger IR spot sizes would result in multiple iris features overlapping with one another (i.e. multiple features would be simultaneously captured or visualized by the reflected IR light), thereby leading to inaccuracies. Having a smaller IR spot size (i.e. a smaller beam) strike the user's iris 475A beneficially reduces the likelihood of having multiple features captured simultaneously. Thus, the disclosed embodiments are able to emit an IR spot that captures at least 2 iris line pairs per millimeter. This accuracy, or rather focused/tight IR spot attribute, allows the system to resolve the user's pupil, thereby allowing the system to track the user's gaze vector to perform eye tracking and to perform iris recognition.

To achieve the accuracy described above, the illumination system is able to determine or identify (e.g., perhaps from recorded data that describes the optical characteristics of the IR illumination device) the focal lengths for both the IR light and the RGB light. To clarify, FIG. 4D shows a focal length of IR light 495A and a focal length of RGB light 495B.

In some embodiments, the (effective) focal length of RGB light 495B is around 3 mm to 5 mm while the (effective) focal length of IR light 495A is around 1.2 mm to 1.5 mm. Thus, in accordance with the disclosed embodiments, the focal length of IR light 495A is relatively smaller than the focal length of RGB light 495B, resulting in a smaller collimated beam size of the IR illumination module. The smaller collimated beam size of the IR illumination module allows for improved spatial resolution of the IR imaging system.

In some cases, the effective focal length of IR light 495A is less than or equal to 2 mm or, in some cases, less than 3 mm. In some cases, the effective focal length of IR light 495A is within a range of 0.75 mm and 3.0 mm, or in some cases between 1.00 mm and 3.00 mm.

In some cases, the effective focal length of RGB light 495B is within a range of 2 mm and 8 mm. Accordingly, from this, it will be appreciated that the focal length of IR light 495A may be different than the focal length of RGB light 495B.

Similar to the differences in focal lengths, a collimated light beam size of the collimated RGB laser light is different than a collimated light beam size of the collimated IR light. For instance, in some embodiments, a collimated light beam size of the IR light is less than 0.5 mm by 0.5 mm. In some embodiments, a collimated light beam size of the RGB laser light is less than 2.0 mm by 2.0 mm.

Modulation transfer function (MTF) refers to a measurement of the ability of an optical system (e.g., the disclosed illumination systems) to extract details of an object (e.g., an eye) and include those details in a digital image (e.g., an image of the user's eye). One of the factors that influences the MTF is the size of the collimated IR laser light, and in particular the collimated IR laser beam size.

For RGB modules, the collimated beam size is typically set to achieve a desired image quality from the waveguide optics for the resulting virtual image. Indeed, the size of the collimated beam size primarily affects MTF and pupil replication of the RGB waveguide system. As such, collimated RGB beam sizes are typically in the ranges specified above, which ranges provide the desired image resolution.

For accurate and detailed iris recognition and eye tracking, however, it is desirable to have relatively smaller collimated IR beam sizes in accordance with the ranges specified above. That is, in order to accurately determine or resolve the attributes of a user's iris (i.e. to identify the line pairs), the collimated IR beam size is often set to be around 0.5 mm by 0.5 mm. Beam sizes within this range allow the MTF to be sufficient so as to accurately generate an image of the user's eye.

It is for this reason (i.e. differences in collimated beam requirements) that the embodiments also rely on separate collimating optics for the RGB laser device and the IR illumination device. For instance, if a common collimating optic were used to collimate both the RGB laser light and the IR laser light, then the IR laser collimated spot size would be too large to resolve individual features of the user's eye. If the input aperture of the waveguide was reduced to make a smaller collimated beam size, then the optical efficiency of the IR laser light would be too low and the system's power consumption for the IR laser device would be overly high such that it could not be reasonably integrated into the system. As such, separate collimating optics are used to collimate IR light and to collimate RGB light.

Figure 5:
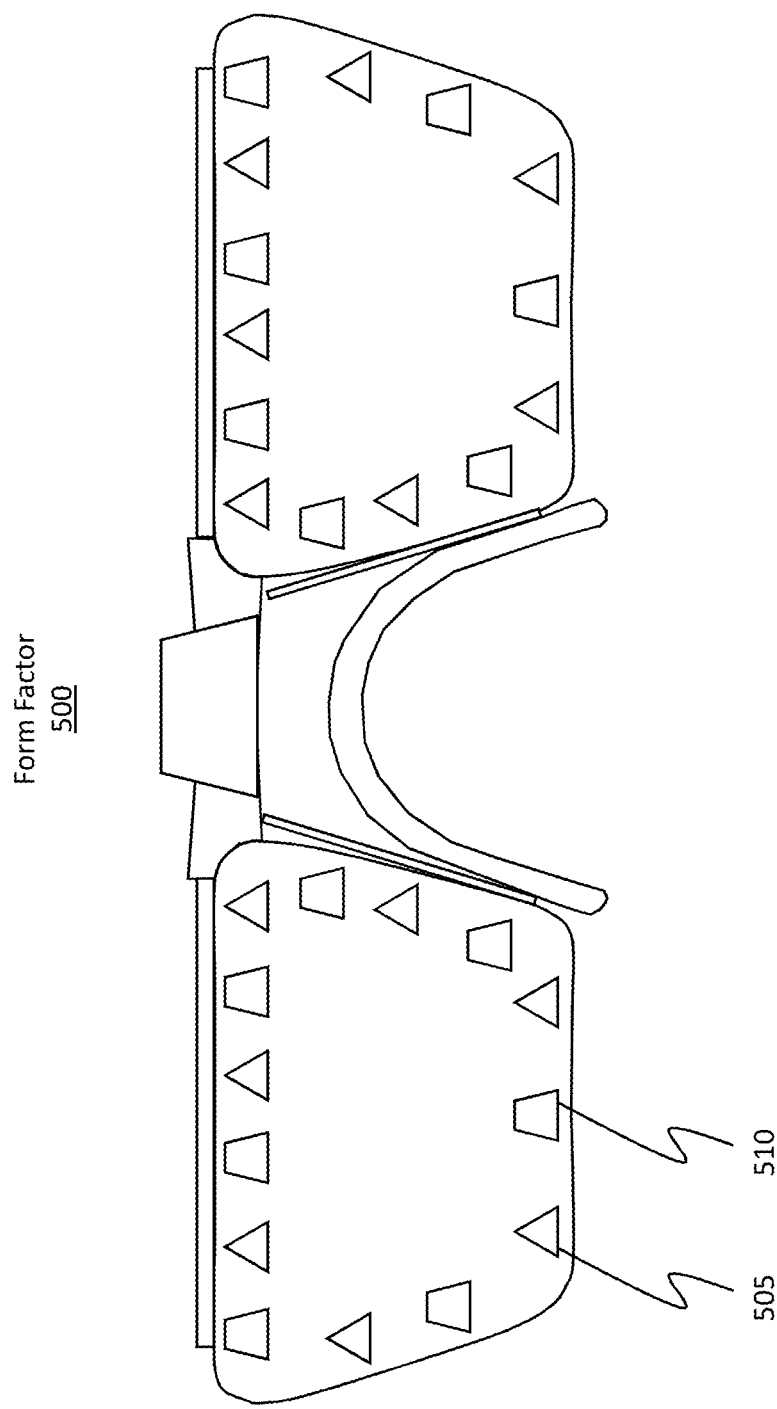
FIG. 5 illustrates an example HMD in the form of glasses, where any number of photodetectors/photodiodes, which include some IR detectors, may be positioned around an outer periphery of the glasses to capture reflected IR light.

FIG. 5 illustrates an example form factor 500 for a HMD of a mixed-reality system. This mixed-reality system includes the illumination system 400 from FIGS. 4A and 4B. As shown, form factor 500 is in the form of glasses. These glasses include one or more photodetectors (e.g., photodetectors 505 and 510), which are representative of the photodetectors discussed earlier. These photodetectors are disposed around an outer perimeter or periphery of the glasses' display area. Accordingly, form factor 500 of the mixed-reality system may be glasses, and the photodetectors 505 and 510 may be disposed around the outer portions of the rims of the glasses.

Improved IR Module with Reduced Z-Dimensional Profile

Figure 6:
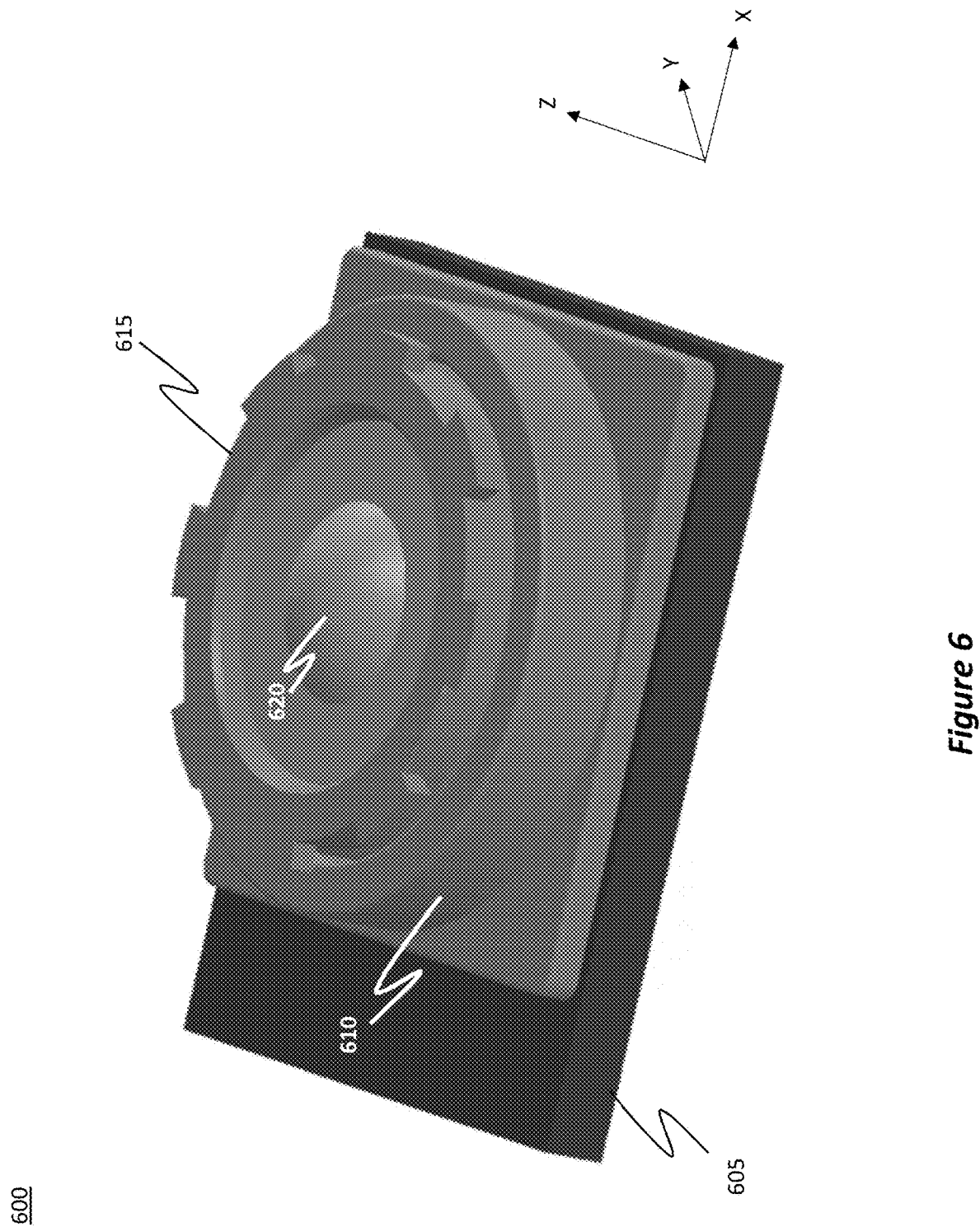
FIG. 6 illustrates an improved IR illumination module that has a reduced z-dimensional profile and a reduced collimated beam size, which is helpful for resolving accurate images of the eye, as a result of redirecting light out of plane relative to the emission orientation of the light source.

FIG. 6 illustrates an improved IR module 600, which is representative of the IR module 405 from FIG. 4A. Here, IR module 600 is mounted to the top portion of a PCB 605, which is operating as the base support platform for IR module 600. In accordance with some of the disclosed embodiments, the reduced z-dimensional profile results in the overall height (in the z-dimension) of the IR module 600 being around 2.00 mm. In some embodiments, the height of the PCB 605 is around 0.5 mm. Consequently, the combined height of the IR module 600 and the PCB 605 is between about 2.00 mm and 2.5 mm. This height is substantially smaller than traditional IR modules in which the IR illuminator device was aligned with the collimating optic. In some cases, the traditional height was over about 8.00 mm or 12.00 mm in the z-dimension, or sometimes around 10.00 mm IR module 600 is shown as including a housing 610 which allows for a threaded lens barrel 615 of a collimating optic 620 to be threaded into it. That is, the threaded lens barrel 615 can be screwed or threaded into the housing 610. As such, collimating optic 620 is mounted to the illumination system via the threaded lens barrel 615 and the housing 610. The threaded lens barrel 615 is configured to permit threadable adjustment of the collimating optic 620 along the z-axis (as shown by the XYZ legend in FIG. 6). As will be shown momentarily, the z-axis corresponds to the direction in which the IR light is collimated as opposed to the direction in which the light is initially emitted. Additionally, the lens housing can be adjusted in the X and Y direction to adjust and compensate pointing errors of the IR laser assembly due to placement and manufacturing tolerances of the laser, mirror, and optic.

Figure 7:
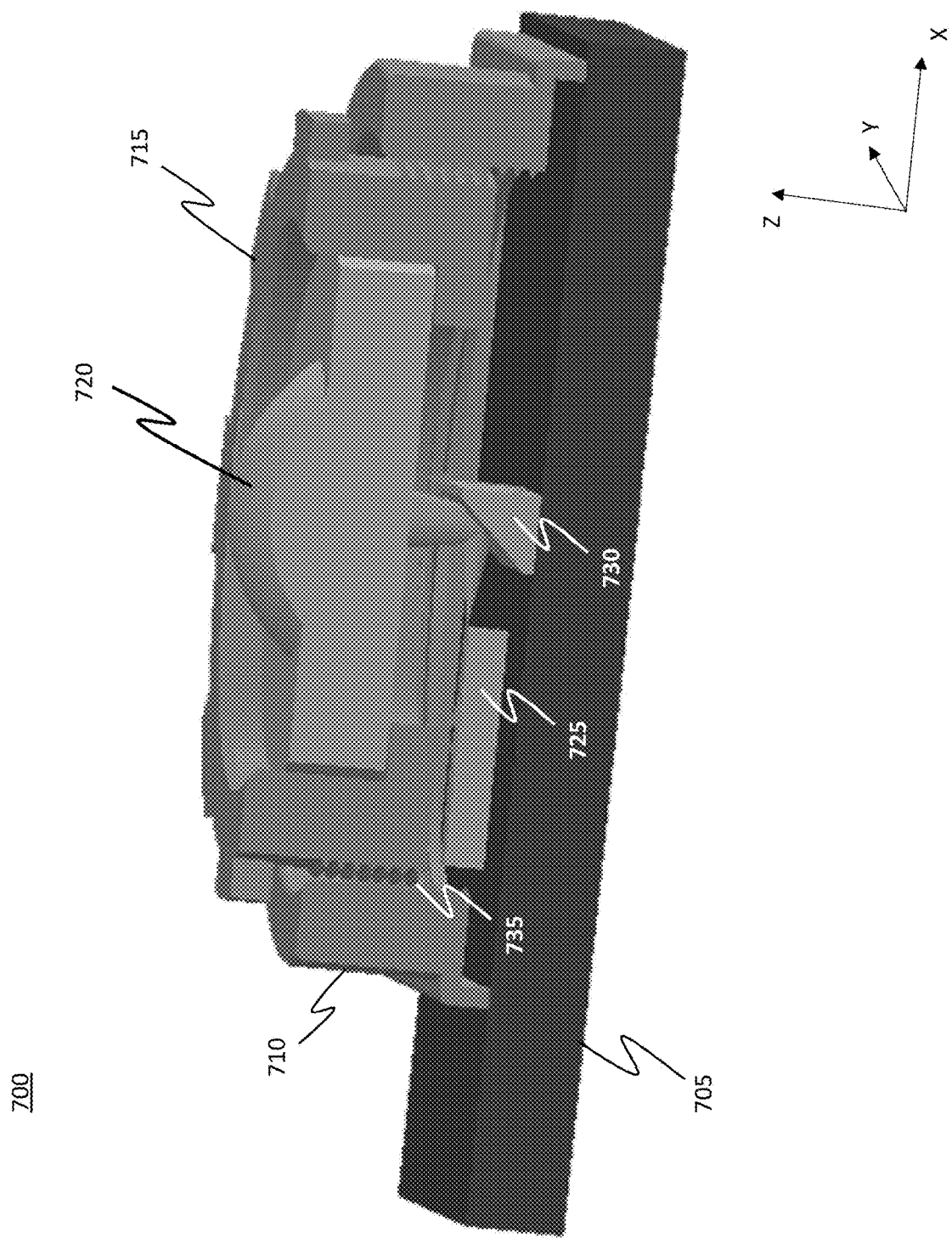
FIG. 7 illustrates a cross sectional view of the improved IR illumination module, where the IR illumination module has been cut in half to visualize the internal portions of the module.

FIG. 7 shows another IR module 700, which is representative of IR module 600 from FIG. 6. Here, however, IR module 700 has been cut in half in order to view the internal portions of IR module 700, as viewed from a side profile view.

Similar to IR module 600, IR module 700 is mounted to the top portion of a PCB 705. IR module 700 also includes a housing 710, a threaded lens barrel 715, and a collimating optic 720, similar to those discussed in connection with FIG. 6.

IR module 700 is also shown as including an IR illumination device 725, which is representative of the IR illumination devices discussed earlier (e.g., IR illumination device 410 from FIG. 4A). As shown, IR illumination device 725 is mounted in a manner so as to be parallel to the orientation of PCB 705. That is, any IR light emitted by IR illumination device 725 will be emitted in a direction parallel to the orientation of PCB 705.

IR illumination device 725 is aimed at a turning optic 730, which is positioned relative to the IR illumination device 725 so as to receive/intercept the IR light generated by IR illumination device 725. Turning optic 730 then redirects the IR light out of plane relative to the emission direction of IR illumination device 725. Further detail on this aspect will be provided in connection with FIG. 8. Additionally, turning optic 730 redirects the IR light towards collimating optic 720 for collimation, as described earlier.

FIG. 7 also more fully illustrates the threadable connection 735 between housing 710 and threaded lens barrel 715. Using this threadable connection 735, the collimating optic 720 can be adjusted in the z-dimension. Adjusting the collimating optic 720 in the z-direction using the threadable connection 735 allows for refinements or adjustments in the collimating optic 720's back focal lengths (i.e. the distance between the laser emitting aperture and the back surface of the collimating optic), which may result in changes to the light beam's dimensions. Furthermore, the threadable connection 735 is configured to allow for extremely fine and precise adjustments in the z-direction. In some embodiments, the housing 710 also allows for movements in the X-Y plane relative to the PCB 705 to correct for pointing error of the collimated beam.

IR module 700, which includes housing 710 and threaded lens barrel 715, provides for an environmentally or hermetically sealed unit. This unit is a robust unit capable of preventing impurities and other types of dust particles from entering the unit.

This unit is also smaller in size (relative to the z-dimension) than traditional units. For instance, traditional systems cause all of the optical components to be aligned in parallel with one another. To illustrate, with reference to the z-dimension of the XYZ legend shown in FIG. 7, traditional systems would also align the IR illumination device 725 in the z-dimension so as to emit laser light directly towards the collimating optic in the z-direction.

Such a traditional configuration results in a larger sized module/unit because the entire length of the IR illumination device 725 is positioned in the z-dimension. In contrast to traditional systems, the disclosed embodiments reduce the size in the z-dimension by orienting the IR illumination device 725 out of plane relative to the collimating optic 720 and using the turning optic 730 to realign the IR light for transmission through the collimating optic 720. By redirecting the light in this manner (e.g., redirecting light initially from an x-axis emission direction to a z-axis redirected direction), the disclosed embodiments provide for an ultra-compact assembly that reduces the overall z-dimensional profile by about the length of the IR illumination device.

That is, because the IR illumination device 725 is now oriented in the x direction (as opposed to the previous z direction), the z-dimensional profile no longer includes the entire length of the IR illumination device 725. Instead, the z-dimensional profile includes only the height of the IR illumination device 725, which height is substantially smaller in size than the length. As such, the z-dimensional profile is beneficially reduced by a substantial amount. For instance, the z-dimensional profile of the IR module 700 is now around 2.00 mm whereas previously it was over 6.00 mm.

As an example, with a traditional TO-style laser package, the stack-up is approximately 1 mm for leads, 3.3 mm for the TO-style laser's can and housing, 1 mm for its back focal length, 1.2 mm for its optical thickness, and 0.5 mm for the housing that holds the optic. These dimensions, when summed together, result in an overall thickness of about 1+3.3+1+1.2+0.5=6 mm.

Figure 8:
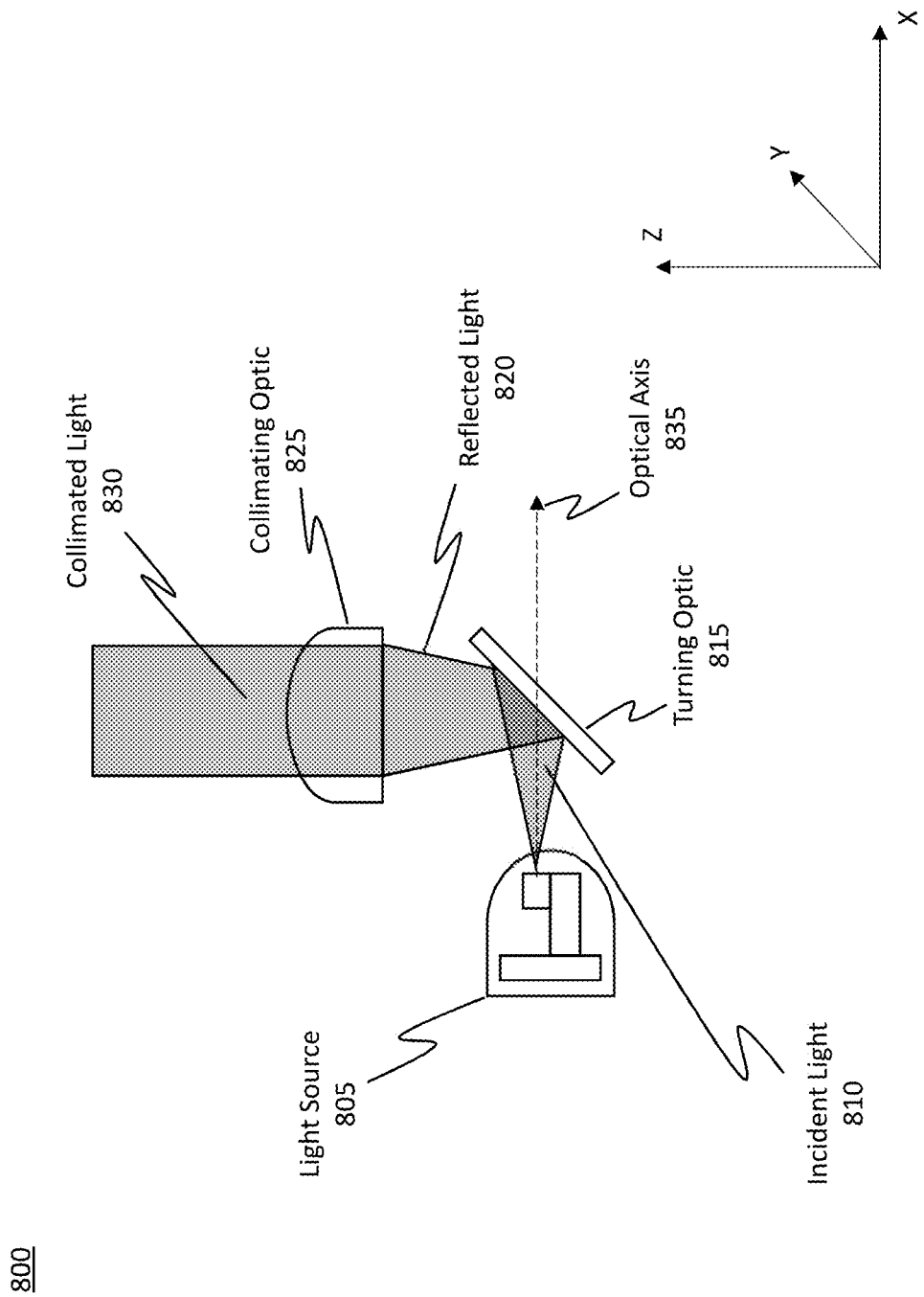
FIG. 8 provides another visualization of the improved IR illumination module and how the IR illumination module is able to redirect light out of plane relative to the emission orientation of the light source.

FIG. 8 illustrates a schematic-like view of an IR module 800, which is representative of the IR modules discussed earlier. Here, IR module includes a light source 805 (e.g., an IR illumination device) that is emitting incident light 810 towards a turning optic 815. Turning optic 815 reflects the incident light 810 out of plane to form reflected light 820. Reflected light 820 is directed towards a collimating optic 825, which collimates the light to generate collimated light 830. FIG. 8 also shows the optical axis 835 of the light source 805. As used herein, the phrase "optical axis" refers to the aiming direction of the light source 805. That is, an optical axis relates to a symbolic line that passes through the laser's center of curvature to define a straight-line path along which laser light propagates.

It will be appreciated that turning optic 815 is able to reflect the incident light 810 at any angle. For instance, incident light 810 may be reflected at any acute angle (e.g., between 0 degrees and 90 degrees) or at any obtuse angle (e.g., greater than 90 degrees). In some embodiments, turning optic 815 reflects incident light 810 between 30 degrees and 120 degrees out of plane relative to the emission orientation of light source 805 (e.g., FIG. 8 shows the emission orientation as being in the x-axis direction). In some embodiments, the turning optic 815 reflects incident light 810 at about 90 degrees. Stated differently, in some embodiments, turning optic 815 reflects incident light 810 to be perpendicular to its original emission direction (e.g., the z-axis direction is perpendicular to the x-axis direction). Accordingly, any reflection angle may be used, and the embodiments should not be limited to specific angles.

Example Method(s) for Performing Eye Tracking and Iris Recognition/Detection

Figure 9:
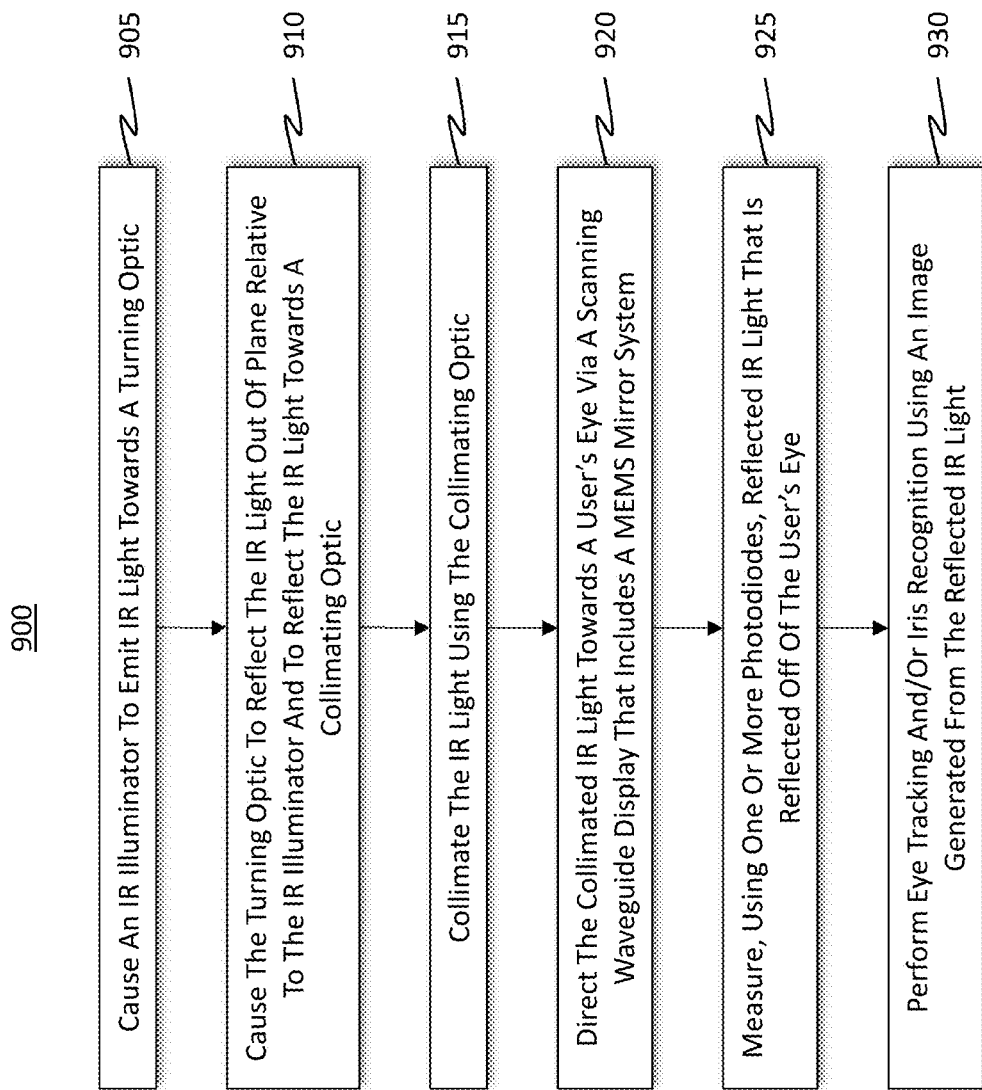
FIG. 9 illustrates a flowchart of an example method for performing eye tracking and/or iris recognition/detection using an integrated scanning waveguide display.

Attention will now be directed to FIG. 9 which refers to a number of method acts that may be performed. Although the method acts may be discussed in a certain order or illustrated in a flow chart as occurring in a particular order, no particular ordering is required unless specifically stated, or required because an act is dependent on another act being completed prior to the act being performed.

FIG. 9 illustrates a flowchart of an example method 900 for using an integrated scanning waveguide display to perform eye tracking and/or iris recognition. Initially, method 900 includes an act 905 of causing an IR illuminator (e.g., IR illumination device 410 from FIG. 4A or light source 805 from FIG. 8) to emit IR light towards a turning optic (e.g., turning optic 420 from FIG. 4A). Use of the turning optic means that the method is utilizing an IR module with a reduced z-dimensional profile, as described earlier.

Act 910 includes causing the turning optic to reflect the IR light out of plane relative to the IR illuminator (e.g., relative to its aiming or emission orientation) and to reflect the IR light towards a collimating optic (e.g., collimating optic 425 from FIG. 4A). In act 915, the collimating optic then collimates the IR light. In act 920, the collimated IR light is then directed towards a user's eye (e.g., eye 475 in FIG. 4B) via a scanning waveguide display that includes a MEMS mirror system (e.g., the scanning waveguide display includes DMA 455 and waveguide 465 from FIG. 4B).

Method 900 then includes act 925 of measuring, using one or more photodetectors/photodiodes (e.g., photodetectors 485A and 485B from FIG. 4B), reflected IR light that is reflected off of the user's eye. In some cases, the reflected IR light is measured by an array of photodiodes (i.e. a combination of multiple photodiodes operating in unison with one another). The photodiodes produce data describing the reflections, where the data is then combined to provide or generate an IR image of the user's eye(s). Act 930 includes performing eye tracking and/or iris recognition using the image(s) generated from the reflected IR light.

Accordingly, the disclosed embodiments relate to an improved type of illumination system capable of performing eye tracking and/or iris recognition via a scanning waveguide display. These functions may be performed through the use of an improved type of IR module. Specifically, the improved IR module has a reduced z-dimensional profile as a result of a turning optic intercepting light received from an IR illumination device and reflecting that light out of plane relative to the IR illumination device's emission direction or orientation (i.e. its optical axis). In doing so, the disclosed embodiments enable the unit to be more compact, thereby allowing more hardware components to be included in the mixed-reality system.

Example Computer System(s)

Figure 10:
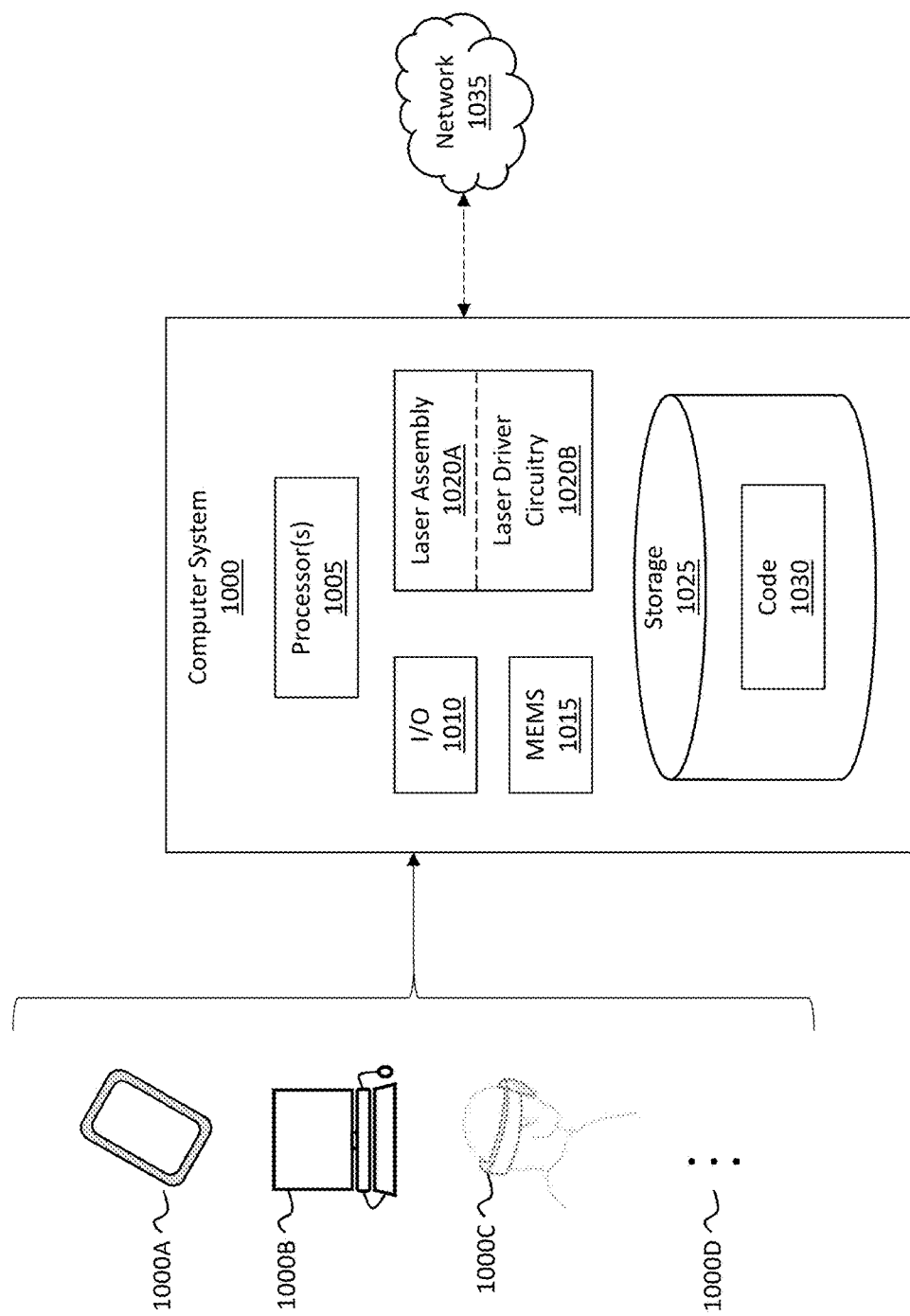
FIG. 10 illustrates an example computer system that is operable to control the components described herein and that is operable to perform any of the disclosed methods and method acts.

Attention will now be directed to FIG. 10 which illustrates an example computer system 1000 that may be used to facilitate the disclosed methods and/or that may comprise one of the disclosed systems, architectures, or illumination systems. It will be appreciated that computer system 1000 may be configured within various form factors. For example, computer system 1000 may be embodied as a tablet 1000A, a desktop 1000B, or a head mounted device (HMD) 1000C (e.g., in form factor 500 as described in connection with FIG. 5). The ellipsis 1000D demonstrates that computer system 1000 may be embodied in various other forms too.

For instance, computer system 1000 may also be a distributed system that includes one or more connected computing components/devices that are in communication with computer system 1000, a laptop computer, a mobile phone, a server, a data center, and/or any other computer system. The ellipsis 1000D also indicates that other system subcomponents may be included or attached with the computer system 1000, including, for example, sensors that are configured to detect sensor data such as user attributes (e.g., heart rate sensors), as well as sensors like cameras and other sensors that are configured to detect sensor data such as environmental conditions and location/positioning (e.g., clocks, pressure sensors, temperature sensors, gyroscopes, accelerometers and so forth), all of which sensor data may comprise different types of information used during application of the disclosed embodiments.

In its most basic configuration, computer system 1000 includes various different components. For example, FIG. 10 shows that computer system 1000 includes at least one processor 1005 (aka a "hardware processing unit"), input/output ("I/O") 1010, a MEMS mirror system 1015, a laser assembly 1020A with laser driver circuitry 1020B, and storage 1025. As used in conjunction with computer system 1000, laser assembly 1020A should be interpreted broadly and may include any lasers, turning optics, and/or collimating optics that were discussed earlier. Accordingly, any of the previously mentioned lasing or optical devices may be included as a part of laser assembly 1020A. Laser driver circuitry 1020B is configured to control the power output and emissions of the lasing and optical devices and/or control the operations of the laser assembly 1020A.

Computer system 1000 may also include a depth engine which includes any type of 3D sensing hardware to scan and generate a spatial mapping of an environment. For instance, the depth engine may include any number of time of flight cameras, stereoscopic cameras, and/or depth cameras. Using these cameras, the depth engine is able to capture images of an environment and generate a 3D representation of that environment. Accordingly, depth engine includes any hardware and/or software components necessary to generate a spatial mapping (which may include depth maps, 3D dot/point clouds, and/or 3D meshes) used to generate or influence virtual images.

Storage 1025 is shown as including executable code/instructions 1030. Storage 1025 may be physical system memory, which may be volatile, non-volatile, or some combination of the two. The term "memory" may also be used herein to refer to non-volatile mass storage such as physical storage media. If computer system 1000 is distributed, the processing, memory, and/or storage capability may be distributed as well. As used herein, the term "executable module," "executable component," or even "component" can refer to software objects, routines, or methods that may be executed on computer system 1000. The different components, modules, engines, and services described herein may be implemented as objects or processors that execute on computer system 1000 (e.g. as separate threads). The executable code/instructions 1030 may be executable to cause computer system 1000 to perform eye tracking and/or iris recognition.

The disclosed embodiments may comprise or utilize a special-purpose or general-purpose computer including computer hardware, such as, for example, one or more processors (such as processor 1005) and system memory (such as storage 1025), as discussed in greater detail below. Embodiments also include physical and other computer-readable media for carrying or storing computer-executable instructions and/or data structures. Such computer-readable media can be any available media that can be accessed by a general-purpose or special-purpose computer system. Computer-readable media that store computer-executable instructions in the form of data are physical computer storage media. Computer-readable media that carry computer-executable instructions are transmission media. Thus, by way of example and not limitation, the current embodiments can comprise at least two distinctly different kinds of computer-readable media: computer storage media and transmission media.

Computer storage media are hardware storage devices, such as RAM, ROM, EEPROM, CD-ROM, solid state drives (SSDs) that are based on RAM, Flash memory, phase-change memory (PCM), or other types of memory, or other optical disk storage, magnetic disk storage or other magnetic storage devices, or any other medium that can be used to store desired program code means in the form of computer-executable instructions, data, or data structures and that can be accessed by a general-purpose or special-purpose computer.

Computer system 1000 may also be connected (via a wired or wireless connection) to external sensors (e.g., one or more remote cameras, accelerometers, gyroscopes, acoustic sensors, magnetometers, etc.). Further, computer system 1000 may also be connected through one or more wired or wireless networks 1035 to remote systems(s) that are configured to perform any of the processing described with regard to computer system 1000.

During use, a user of computer system 1000 is able to perceive information (e.g., a mixed-reality environment) through a display screen that is included with the I/O 1010 of computer system 1000 and that is visible to the user. The I/O interface(s) and sensors with the I/O 1010 also include gesture detection devices, eye trackers, and/or other movement detecting components (e.g., cameras, gyroscopes, accelerometers, magnetometers, acoustic sensors, global positioning systems ("GPS"), etc.) that are able to detect positioning and movement of one or more real-world objects, such as a user's hand, a stylus, and/or any other object(s) that the user may interact with while being immersed in the scene.

A graphics rendering engine may also be configured, with processor 1005, to render one or more virtual objects within a mixed-reality scene/environment. As a result, the virtual objects accurately move in response to a movement of the user and/or in response to user input as the user interacts within the virtual scene.

A "network," like the network 1035 shown in FIG. 10, is defined as one or more data links and/or data switches that enable the transport of electronic data between computer systems, modules, and/or other electronic devices. When information is transferred, or provided, over a network (either hardwired, wireless, or a combination of hardwired and wireless) to a computer, the computer properly views the connection as a transmission medium. Computer system 1000 will include one or more communication channels that are used to communicate with the network 1035. Transmissions media include a network that can be used to carry data or desired program code means in the form of computer-executable instructions or in the form of data structures. Further, these computer-executable instructions can be accessed by a general-purpose or special-purpose computer. Combinations of the above should also be included within the scope of computer-readable media.

Upon reaching various computer system components, program code means in the form of computer-executable instructions or data structures can be transferred automatically from transmission media to computer storage media (or vice versa). For example, computer-executable instructions or data structures received over a network or data link can be buffered in RAM within a network interface module (e.g., a network interface card or "NIC") and then eventually transferred to computer system RAM and/or to less volatile computer storage media at a computer system. Thus, it should be understood that computer storage media can be included in computer system components that also (or even primarily) utilize transmission media.

Computer-executable (or computer-interpretable) instructions comprise, for example, instructions that cause a general-purpose computer, special-purpose computer, or special-purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the embodiments may be practiced in network computing environments with many types of computer system configurations, including personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The embodiments may also be practiced in distributed system environments where local and remote computer systems that are linked (either by hardwired data links, wireless data links, or by a combination of hardwired and wireless data links) through a network each perform tasks (e.g. cloud computing, cloud services and the like). In a distributed system environment, program modules may be located in both local and remote memory storage devices.

Additionally, or alternatively, the functionality described herein can be performed, at least in part, by one or more hardware logic components (e.g., the processor 1005). For example, and without limitation, illustrative types of hardware logic components that can be used include Field-Programmable Gate Arrays (FPGAs), Program-Specific or Application-Specific Integrated Circuits (ASICs), Program-Specific Standard Products (ASSPs), System-On-A-Chip Systems (SOCs), Complex Programmable Logic Devices (CPLDs), Central Processing Units (CPUs), and other types of programmable hardware.

It will be appreciated that computer system 1000 may include one or more processors (e.g., processor(s) 1005) and one or more computer-readable hardware storage devices (e.g., storage 1025), where the storage devices include computer-executable instructions that are executable by the one or more processors to perform any method (e.g., method 900 presented in FIG. 9). In this regard, computer system 1000 is also highly flexible and can perform numerous operations. Furthermore, computer system 1000 may perform eye tracking and/or iris recognition in the manner disclosed herein.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An illumination system having a reduced z-dimensional profile by reflecting light out of plane relative to a light source that generated the light, the illumination system comprising:

an infrared (IR) illumination device that generates IR light, wherein a focal length associated with the IR illumination device and the IR light is between 1.2 millimeters (mm) to 1.5 mm, and wherein, as a result of the focal length being between 1.2 mm and 1.5 mm, a resulting resolution of the IR light is controlled by the IR illumination device;

a collimating optic that collimates light passing therethrough such that a beam of the light is non-diverging after passing through the collimating optic;

a turning optic that receives the IR light from the IR illumination device and that reflects the IR light as reflected IR light, the reflected IR light having a beam that is diverging;

wherein the reflected IR light is reflected out of plane relative to the IR illumination device toward the collimating optic such that the turning optic is aimed at the collimating optic, wherein no intervening optical elements are disposed between the turning optic and the collimating optic, wherein the collimating optic collimates the beam of the reflected IR light such that the beam of the reflected IR light is non-diverging after the beam of the reflected IR light passes through the collimating optic, and wherein the reflected IR light is then emitted from the collimating optic as collimated IR light having a non-diverging beam;

a waveguide positioned in a fixed position relative to the collimating optic, wherein the waveguide includes an input port positioned to receive the collimated IR light, and a plurality of photodetectors disposed around an outer periphery of a display area of the illumination system, wherein:

the plurality of photodetectors measure reflected light that is reflected off of an iris of a user who is wearing the illumination system, the reflected light is a reflected form of the collimated IR light, and a resolution of the reflected light is based on said focal length and is set to detect at least two iris line pairs per millimeter of the user's iris.

2. The illumination system of claim 1, wherein the turning optic reflects the IR light between 30 degrees and 120 degrees out of plane relative to the IR illumination device.

3. The illumination system of claim 1, wherein the collimating optic is mounted to the illumination system with a threaded lens barrel configured to permit threadable adjustment of the collimating optic along a z-axis in a direction of the collimated IR light as the collimated IR light is emitted from the collimating optic.

4. The illumination system of claim 1, wherein the illumination system further includes a red, green, blue (RGB) laser device that emits RGB laser light.

5. The illumination system of claim 4, wherein the collimating optic that emits the collimated IR light constitutes a second collimating optic, and wherein the RGB laser light passes through a first collimating optic to produce collimated RGB laser light.

6. The illumination system of claim 5, wherein a beam size of the collimated RGB laser light is different than a beam size of the collimated IR light, the beam size of the collimated IR light being about 0.5 mm by 0.5 mm.

7. The illumination system of claim 1, wherein the illumination system further includes a display module assembly (DMA) that includes a microelectromechanical scanning (MEMS) mirror system.

8. The illumination system of claim 7, wherein the DMA optically combines the collimated IR light with laser light generated by a red, green, blue (RGB) laser device.

9. The illumination system of claim 1, wherein the waveguide directs the collimated IR light towards an eye of a user of the illumination system.

10. The illumination system of claim 1, wherein the illumination system is configured to use the collimated IR light to perform either eye tracking or iris recognition.

11. The illumination system of claim 1, wherein the IR illumination device is mounted in parallel to a PCB board, and wherein the turning optic reflects the IR light perpendicularly to the PCB board.

12. The illumination system of claim 11, wherein no intervening optical elements are disposed between the IR illumination device and the turning optic.

13. The illumination system of claim 1, wherein a combined height of the IR illumination device and a PCB board on which the IR illumination device is disposed is between 2 millimeters and 2.5 millimeters.

14. The illumination system of claim 13, wherein a height of the IR illumination device is 2 millimeters.

15. The illumination system of claim 13, wherein a height of the PCB board is 0.5 millimeters.

* * * * *